(12) United States Patent
Kang et al.

(10) Patent No.: US 10,734,458 B2
(45) Date of Patent: Aug. 4, 2020

(54) DISPLAY APPARATUS INCLUDING SENSOR

(71) Applicant: SAMSUNG DISPLAY CO., LTD., Yongin-si, Gyeonggi-do (KR)

(72) Inventors: Jangmi Kang, Yongin-si (KR); Jisun Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 137 days.

(21) Appl. No.: 15/882,417

(22) Filed: Jan. 29, 2018

(65) Prior Publication Data

US 2019/0035859 A1    Jan. 31, 2019

(30) Foreign Application Priority Data

Jul. 28, 2017   (KR) .................. 10-2017-0096376

(51) Int. Cl.
| | |
|---|---|
| *G06K 9/00* | (2006.01) |
| *H01L 27/32* | (2006.01) |
| *G06F 3/044* | (2006.01) |
| *G06F 3/041* | (2006.01) |
| *H01L 51/52* | (2006.01) |

(52) U.S. Cl.
CPC ............ *H01L 27/323* (2013.01); *G06F 3/044* (2013.01); *G06F 3/0412* (2013.01); *G06K 9/0002* (2013.01); *G06K 9/0004* (2013.01); *H01L 27/3234* (2013.01); *H01L 51/5225* (2013.01); *H01L 51/5284* (2013.01); *G06F 2203/04107* (2013.01); *H01L 27/3216* (2013.01); *H01L 27/3218* (2013.01); *H01L 27/3272* (2013.01); *H01L 27/3276* (2013.01)

(58) Field of Classification Search
CPC ...... G06F 3/0412; G06F 3/0416; G06F 3/044; H01L 27/323
USPC .................................................. 345/173, 174
See application file for complete search history.

(56) References Cited

U.S. PATENT DOCUMENTS

| | | | |
|---|---|---|---|
| 9,395,835 B2* | 7/2016 | No ...................... | G02F 1/13338 |
| 9,542,588 B2* | 1/2017 | Kremin ............... | G06K 9/0002 |
| 9,870,082 B2* | 1/2018 | Hu ....................... | G06F 3/0412 |
| 2008/0121442 A1 | 5/2008 | Boer et al. | |
| 2016/0320918 A1* | 11/2016 | Hara ..................... | G06F 3/0416 |
| 2017/0046558 A1 | 2/2017 | Li et al. | |
| 2017/0060313 A1 | 3/2017 | Kim et al. | |
| 2017/0199610 A1 | 7/2017 | Kitchens | |
| 2018/0059855 A1* | 3/2018 | Gwon ................... | G06F 3/0412 |

FOREIGN PATENT DOCUMENTS

| | | |
|---|---|---|
| KR | 1020160014716 A | 2/2016 |
| KR | 1020170026919 A | 3/2017 |

* cited by examiner

*Primary Examiner* — Calvin C Ma
(74) *Attorney, Agent, or Firm* — Cantor Colburn LLP

(57) ABSTRACT

A display apparatus including a sensor includes: a pixel group including a predetermined number of pixels, each of which includes a pixel circuit and a light-emitting device electrically connected to the pixel circuit; and a sensing pixel including a sensing circuit and a sensing electrode connected to the sensing circuit, where the sensing electrode forms a variable capacitor with respect to a finger, and the sensing circuit is arranged around the pixel circuit of the pixel group.

17 Claims, 17 Drawing Sheets

DISPLAY APPARATUS INCLUDING SENSOR

This application claims priority to Korean Patent Application No. 10-2017-0096376, filed on Jul. 28, 2017, and all the benefits accruing therefrom under 35 U.S.C. § 119, the content of which in its entirety is herein incorporated by reference.

BACKGROUND

1. Field

One or more embodiments relate to a display apparatus including a sensor.

2. Description of the Related Art

Recently, techniques for measuring or sensing bio-information are in demand. Various researches have been conducted to implement a sensor for measuring bio-information in a display apparatus.

SUMMARY

One or more embodiments provide a display apparatus having a display function and a fingerprint recognition function.

According to an embodiment, a display apparatus, which includes a sensor, includes: a pixel group including a predetermined number of pixels, where each of the predetermined number of pixels includes a pixel circuit and a light-emitting device electrically connected to the pixel circuit; and a sensing pixel including a sensing circuit and a sensing electrode connected to the sensing circuit, where the sensing pixel forms a variable capacitor with respect to a finger, and the sensing circuit is arranged around the pixel circuits of the pixel group.

In an embodiment, the light-emitting device may include a first electrode connected to the pixel circuit, a second electrode opposite to the first electrode, and an emission layer between the first electrode and the second electrode, and the sensing electrode may be disposed in a same layer as the first electrode of the light-emitting device.

In an embodiment, an opening may be defined through the second electrode of the light-emitting device in a region corresponding to the sensing electrode.

In an embodiment, the sensing electrode may extend along peripheries of first electrodes in light-emitting devices of the pixel group.

In an embodiment, the light-emitting device may include a first electrode connected to the pixel circuit, a second electrode facing the first electrode, and an emission layer between the first electrode and the second electrode, and the sensing electrode may be disposed on the second electrode of the light-emitting device.

In an embodiment, an opening may be defined through the second electrode of the light-emitting device in a region corresponding to the sensing electrode, and the sensing electrode may contact an electrode layer, which is in a same layer as the first electrode, via the opening.

In an embodiment, the electrode layer may be connected to the sensing circuit.

In an embodiment, the display apparatus may further include a shield line which prevents a parasitic capacitor among pixel circuits of the pixel group.

In an embodiment, the shield line may be a floating wire.

In an embodiment, a predetermined voltage may be applied to the shield line.

In an embodiment, pixel circuits in the pixel group may be arranged symmetrical with one another in a transverse direction.

In an embodiment, each of the predetermined number of pixels may include at least two sub-pixels.

According to another embodiment, a display apparatus including a sensor includes: a substrate; a plurality of pixel circuits on the substrate; a sensing circuit on the substrate and arranged to surround the plurality of pixel circuits; a plurality of light-emitting devices on the pixel circuits, where the plurality of light-emitting device includes first electrodes and second electrodes opposite to the first electrodes, and each of the first electrodes is connected to a corresponding pixel circuit from among the plurality of pixel circuits; and a sensing electrode arranged on the sensing circuit, and electrically connected to the sensing circuit, where the sensing electrode forms a variable capacitor with respect to a finger.

In an embodiment, the sensing electrode may be in a same layer as the first electrodes and extend along peripheries of the first electrodes of the plurality of light-emitting devices, and an opening may be defined through each of the second electrodes in a region corresponding to the sensing electrode.

In an embodiment, the sensing electrode may overlap the first electrodes of the plurality of light-emitting devices on the second electrodes, and an opening may be defined through each of the second electrode in a region corresponding to the sensing electrode.

In an embodiment, the display apparatus may further include an electrode layer in a same layer as the first electrodes, where the electrode layer may be electrically connected to the sensing circuit, and contact the sensing electrode via the opening.

In an embodiment, the display apparatus may further include a shield line arranged between the pixel circuits, where the shield line prevents a parasitic capacitor among the pixel circuits.

In an embodiment, the shield line may be a floating wire.

In an embodiment, a predetermined voltage may be applied to the shield line.

In an embodiment, the pixel circuits may be arranged symmetrically with each other at least in a transverse direction.

BRIEF DESCRIPTION OF THE DRAWINGS

These and/or other features will become apparent and more readily appreciated from the following description of the embodiments, taken in conjunction with the accompanying drawings, in which.

DETAILED DESCRIPTION

Figure 1:
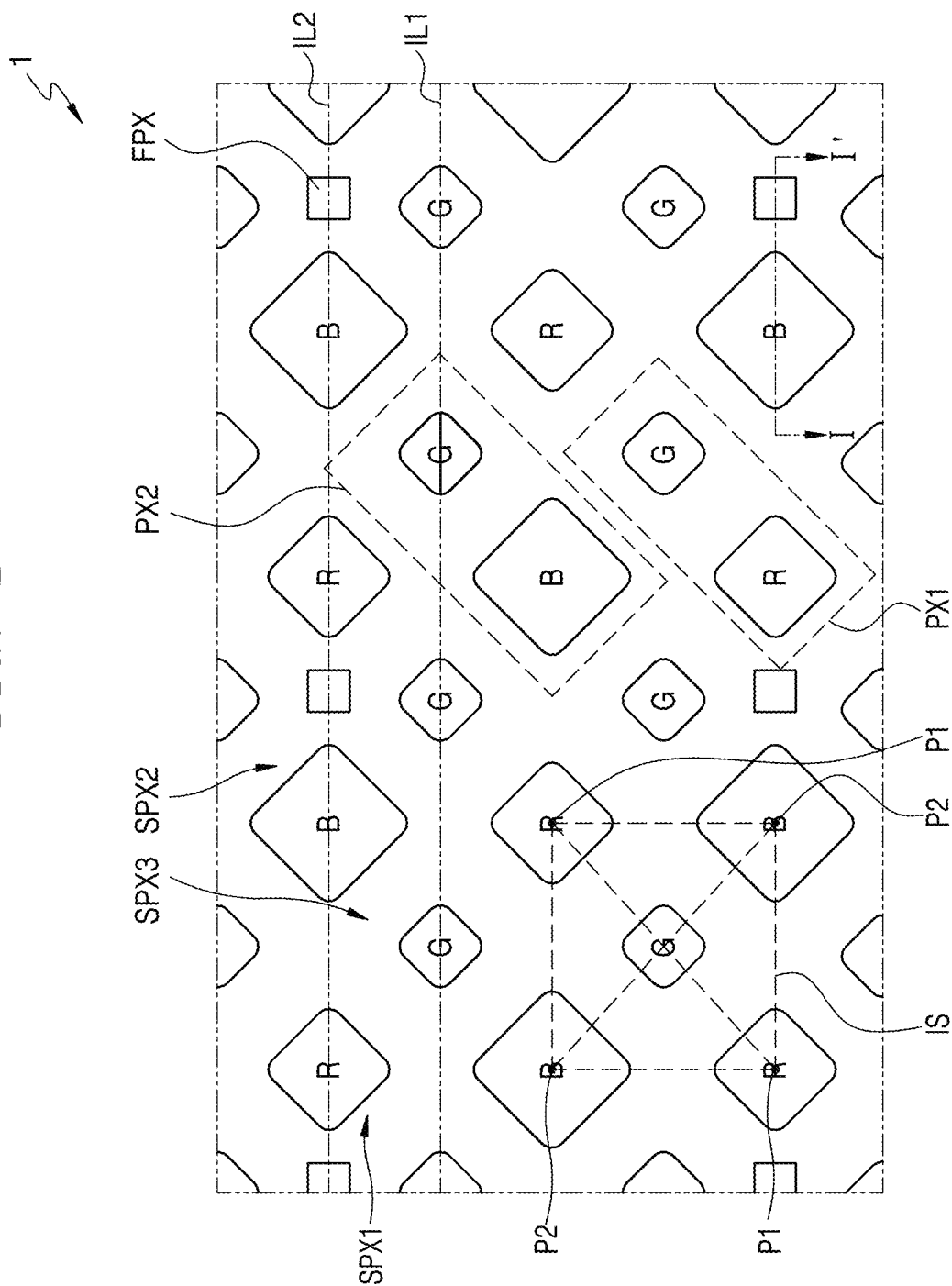
FIG. 1 is a partial plan view of an organic light-emitting display apparatus according to an embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

When a certain embodiment may be implemented differently, a specific process order may be performed differently from the described order. For example, two consecutively described processes may be performed substantially at the same time or performed in an order opposite to the described order.

Hereinafter, exemplary embodiments of the invention will be described in detail with reference to the accompanying drawings. In the drawings, a same or like components will be referred to as a same or like reference numeral, and any repetitive detailed description thereof may be omitted or simplified.

FIG. 1 is a partial plan view of an organic light-emitting display apparatus 1 according to an embodiment of the disclosure.

Referring to FIG. 1, a plurality of sub-pixels is arranged on a display area of the organic light-emitting display apparatus 1. In one embodiment, for example, the organic light-emitting display apparatus 1 may include a plurality of first sub-pixels SPX1, a plurality of second sub-pixels SPX2, and a plurality of third sub-pixels SPX3. The first sub-pixel SPX1, the second sub-pixel SPX2, and the third sub-pixel SPX3 may be repeatedly arranged according to a predetermined pattern in column and row directions.

In such an embodiment, the third sub-pixel SPX3 may have a smaller area than neighboring first sub-pixel SPX1 and second sub-pixel SPX2. The third sub-pixel SPX3 may be a green sub-pixel G that emits green light. The plurality of third sub-pixels SPX3 are spaced apart from one another and arranged on a first line IL1 that is an imaginary line. The third sub-pixel SPX3 may have various shapes such as a polygonal shape, e.g., square, octagon, etc., a round shape, e.g., a circular shape, an oval shape, etc., or a polygonal shape having a rounded corner.

In an embodiment, the first sub-pixels SPX1 are located at a pair of first vertices P1 diagonally facing each other in an imaginary quadrangle IS having a center point of the third sub-pixels SPX3 as a center point thereof, and the second sub-pixels SPX2 are located at a pair of second vertices P2 diagonally facing each other in the imaginary quadrangle IS. The imaginary quadrangle IS may be a square.

The first sub-pixel SPX1 is spaced apart from the second sub-pixel SPX2 and the third sub-pixel SPX3, and has a center point at the first vertex P1 of the imaginary quadrangle IS. The first sub-pixel SPX1 may have a greater area than the neighboring third sub-pixel SPX3. The first sub-pixel SPX1 may be a red sub-pixel R that emits red light. The first sub-pixel SPX1 may have various shapes such as a polygonal shape, e.g., square, octagon, etc., a round shape, e.g., a circular shape, an oval shape, etc., or a polygonal shape having a rounded corner.

The second sub-pixel SPX2 is spaced apart from the first sub-pixel SPX1 and the third sub-pixel SPX3, and has a center point at the second vertex P2 that is adjacent to the first vertex P1 of the imaginary quadrangle IS. In an embodiment, as shown in FIG. 1, the second sub-pixel SPX2 may have a greater area than the neighboring third sub-pixel SPX3. In such an embodiment, the second sub-pixel SPX2 may have a different area from that of the first sub-pixel SPX1, for example, the second sub-pixel SPX2 may have a greater area than the first sub-pixel SPX1. In an alternative embodiment, an area of the second sub-pixel SPX2 may be equal to that of the first sub-pixel SPX1. The second sub-pixel SPX2 may be a blue sub-pixel B that emits blue light. The second sub-pixel SPX2 may have various shapes such as a polygonal shape, e.g., square, octagon, etc., a round shape, e.g., a circular shape, an oval shape, etc., or a polygonal shape having a rounded corner.

In an embodiment, the plurality of first sub-pixels SPX1 and the plurality of second sub-pixels SPX2 are arranged alternately with each other on an imaginary second line IL2. In such an embodiment, the plurality of first sub-pixels SPX1 having center points at the first vertex P1 and the plurality of second sub-pixels SPX2 having the center points at the second vertex P2 respectively surround the third sub-pixels SPX3.

In such an embodiment, where the plurality of first sub-pixels SPX1 and the plurality of second sub-pixels SPX2 are respectively arranged to surround the third sub-pixels SPX3, each of the first sub-pixel SPX1, the second sub-pixel SPX2, and the third sub-pixel SPX3 may have an improved aperture ratio. In such an embodiment, quality of images displayed by the organic light-emitting display apparatus 1 is improved, and manufacturing time and manufacturing costs of the organic light-emitting display apparatus 1 may be reduced.

In an embodiment, due to the arrangement of the sub-pixels described above, intervals among the sub-pixels that emit the light of a same color are increased to improve deposition reliability, and intervals among the sub-pixels that emit light of different colors, that is, the red, green and blue sub-pixels, are reduced to improve the aperture ratio.

In an embodiment, the organic light-emitting display apparatus 1 may have an arrangement of the sub-pixels, in which the first sub-pixel SPX1, the second sub-pixel SPX2, and the third sub-pixel SPX3 respectively emit red light, blue light and green light, but embodiments are not limited thereto. In an alternative embodiment, the first sub-pixel SPX1, the second sub-pixel SPX2 and the third sub-pixel SPX3 may respectively emit light different from the red light, the blue light, and the green light. In one alternative embodiment, for example, one or more of the first sub-pixel SPX1 and the second sub-pixel SPX2 may emit white light.

Two sub-pixels may collectively define a unit pixel. In an embodiment, a first pixel PX1 includes the first sub-pixel SPX1 and the third sub-pixel SPX3, and a second pixel PX2 includes the second sub-pixel SPX2 and the third sub-pixel SPX3. The first pixel PX1 and the second pixel PX2 are alternately arranged with each other to be close to each other.

According to an embodiment, the organic light-emitting display apparatus 1 may include a sensor. The sensor may include a plurality of sensing pixels FPX located adjacent to at least one pixel in the display area. The sensor may be a fingerprint sensor for sensing a fingerprint. The fingerprint sensor may include a sensing electrode forming a capacitor with a finger.

Figure 2:
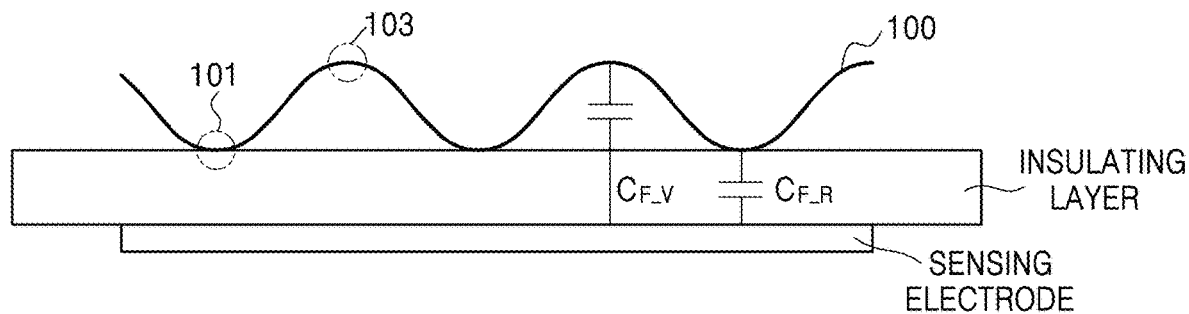
FIG. 2 is a diagram illustrating fingerprint recognition of a sensing pixel according to an embodiment of the disclosure.

FIG. 2 is a diagram illustrating fingerprint recognition of a sensing pixel FPX according to an embodiment of the disclosure. Referring to FIG. 2, a fingerprint 100 has a height variation between ridges 101 and valleys 103, and accordingly, a capacitance $C_{F\_V}$ between the ridge 101 and the sensing electrode and a capacitance $C_{F\_R}$ between the valley 103 and the sensing electrode are different from each other. In such an embodiment, the fingerprint may be recognized based on such a difference between the capacitances.

In such an embodiment, it is desired to appropriately arrange pixels of the display apparatus and pixels of the fingerprint sensor and arrange the sensing electrode for improving fingerprint sensing performance.

Figure 3:
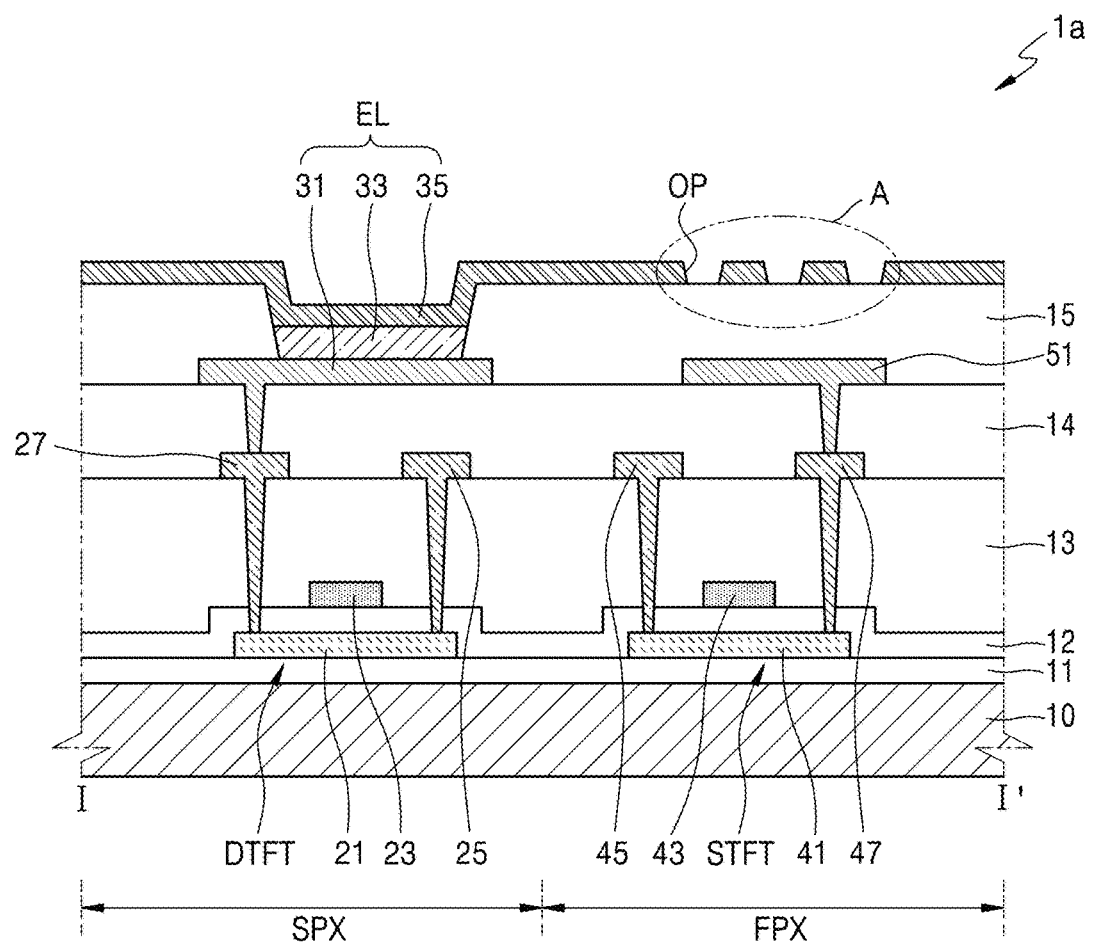
FIG. 3 is a cross-sectional view taken along line I-I' of FIG. 1.

FIG. 3 is a cross-sectional view taken along line I-I' of FIG. 1.

Referring to FIG. 3, an embodiment of an organic light-emitting display apparatus 1a may include a first area on which sub-pixels SPX are arranged and a second area on which sensing pixels FPX are arranged.

In an embodiment, the sub-pixels SPX, each of which includes a pixel circuit including a thin film transistor DTFT and a light-emitting device EL connected to the pixel circuit, may be disposed in the first area on a substrate 10. The pixel circuit may further include a capacitor.

The thin film transistor DTFT includes an active layer 21, a gate electrode 23, a source electrode 25, and a drain electrode 27. The source electrode 25 and the drain electrode 27 are electrically connected to a source region and a drain region of the active layer 21, respectively.

A buffer layer 11 is disposed between the substrate 10 and the thin film transistor DTFT.

A first insulating layer 12 is disposed between the active layer 21 and the gate electrode 23, and a second insulating layer 13 is disposed between the gate electrode 23 and the source and drain electrodes 25 and 27.

The light-emitting device EL includes a first electrode 31, a second electrode 35 facing the first electrode 31, and an intermediate layer 33 between the first electrode 31 and the second electrode 35 and including an organic emission layer. The first electrode 31 is disposed on a third insulating layer 14 that covers the pixel circuit, and is electrically connected to the source electrode 25 or the drain electrode 27 (the drain electrode 27 in the embodiment illustrated with reference to FIG. 3). Edges of the first electrode 31 may be covered by a pixel-defining layer 15.

The first electrode 31 may be in an island shape in each sub-pixel independently from another first electrode, i.e., the first electrode of another pixel. The second electrode 35 may be a thin film having a thickness of a few to tens of nanometers (nm), and may be provided throughout the entire sub-pixels of the organic light-emitting display apparatus to be electrically connected to another second electrode, i.e., the second electrode of another pixel. The second electrode 35 covers an upper portion of the pixel-defining layer 15 and disposed on an entire surface of the substrate 10.

The intermediate layer 33 includes an organic emission layer that emits light, and additionally, may further include at least one of a hole injection layer ("HIL"), a hole transport layer ("HTL"), an electron transport layer ("ETL"), and an electron injection layer ("EIL"). However, embodiments are not limited thereto, and alternatively, various functional layers may be further disposed between the first electrode 31 and the second electrode 35.

The organic emission layer may emit red light, green light, or blue light. However, embodiments are not limited thereto, that is, the organic emission layer may emit white light. In this case, the organic emission layer may have a structure in which a light-emitting material emitting red light, a light-emitting material emitting green light, and a light-emitting material emitting blue light are stacked, or a structure in which the light-emitting material emitting red light, the light-emitting material emitting green light, and the light-emitting material emitting blue light are mixed.

In such an embodiment, the sensing pixels FPX, each of which includes a sensing circuit including a sensing thin film transistor STFT and a sensing electrode 51 connected to the sensing circuit, may be disposed in the second area on the substrate 10. The sensing circuit may further include a capacitor.

The sensing thin film transistor STFT includes an active layer 41, a gate electrode 43, a source electrode 45, and a drain electrode 47. The source electrode 45 and the drain electrode 47 are electrically connected to a source region and a drain region of the active layer 41, respectively.

The buffer layer 11 is disposed between the substrate 10 and the sensing thin film transistor STFT.

The first insulating layer 12 is disposed between the active layer 41 and the gate electrode 43, and the second insulating layer 13 is disposed between the gate electrode 43 and the source and drain electrodes 45 and 47.

The sensing electrode 51 forms a variable capacitor with a finger so that a fingerprint of the finger may be recognized. The sensing electrode 51 is disposed on the third insulating layer 14, and is electrically connected to the source electrode 45 or the drain electrode 47 (the drain electrode 47 in the embodiment illustrated with reference to FIG. 3). The sensing electrode 51 is covered by the pixel-defining layer 15. The sensing electrode 51 does not overlap with the first electrode 31 of the sub-pixel SPX when viewed from a plan view in a thickness direction of the substrate 10, and may be in a form of an independent island around the first electrode 31.

In an embodiment, as shown in FIG. 3, a part of the second electrode 35 located above or to overlap the sensing electrode 51 may include a pattern area A, in which a plurality of openings OP that partially expose the pixel-defining layer 15 is defined. Accordingly, in such an embodiment, influence of the second electrode 35 on the variable capacitor between the finger and the sensing electrode 51 may be reduced, and accordingly, fingerprint sensing efficiency may be improved.

Figure 4:
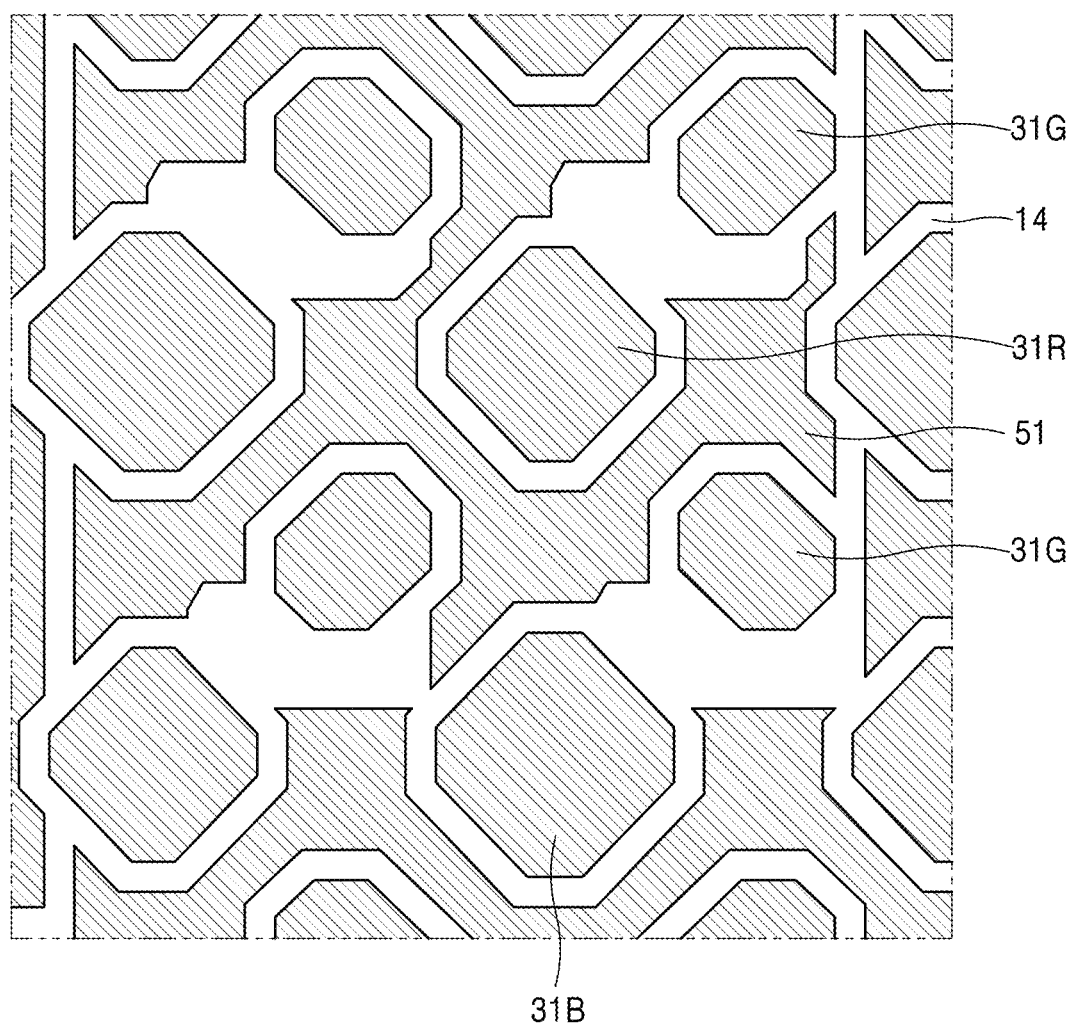
FIG. 4 is a plan view showing an arrangement of a first electrode of a sub-pixel and a sensing electrode of a sensing pixel shown in FIG. 3.

FIG. 4 is a plan view showing arrangement of the first electrode 31 of the sub-pixel SPX and the sensing electrode 51 of the sensing pixel FPX shown in FIG. 3.

Referring to FIG. 4, the first electrode 31 is arranged in each sub-pixel SPX on the third insulating layer 14, and the sensing electrode 51 may be arranged adjacent to the first electrode 31 (e.g., 31R, 31B and 31G) of the sub-pixel SPX.

The first electrode 31 may have a size corresponding to that of the sub-pixel shown in FIG. 1. In one embodiment, for example, a first electrode 31R of a first sub-pixel SPX1, a first electrode 31B of a second sub-pixel SPX2, and a first electrode 31G of a third sub-pixel SPX3 may have different sizes from one another.

The sensing electrode 51 extends along with peripheral portions of the first electrodes 31 of the plurality of sub-pixels SPX to be distributed widely to ensure a sensing area. The sensing electrode 51 may have a shape and a size that vary depending on the shapes, sizes, and arrangement of the first electrodes 31.

The second electrode 35 of the organic light-emitting display apparatus 1a may be sealed by an encapsulation member (not shown) thereon.

In one embodiment, for example, the encapsulation member may be an encapsulation thin film. The encapsulation member may include a film comprising an inorganic material such as silicon oxide or silicon nitride, or may have a structure in which an inorganic layer and a layer including an organic material such as epoxy or polyimide are alternately stacked one on another.

In an alternative embodiment, the encapsulation member may be an encapsulation substrate.

Figure 5:
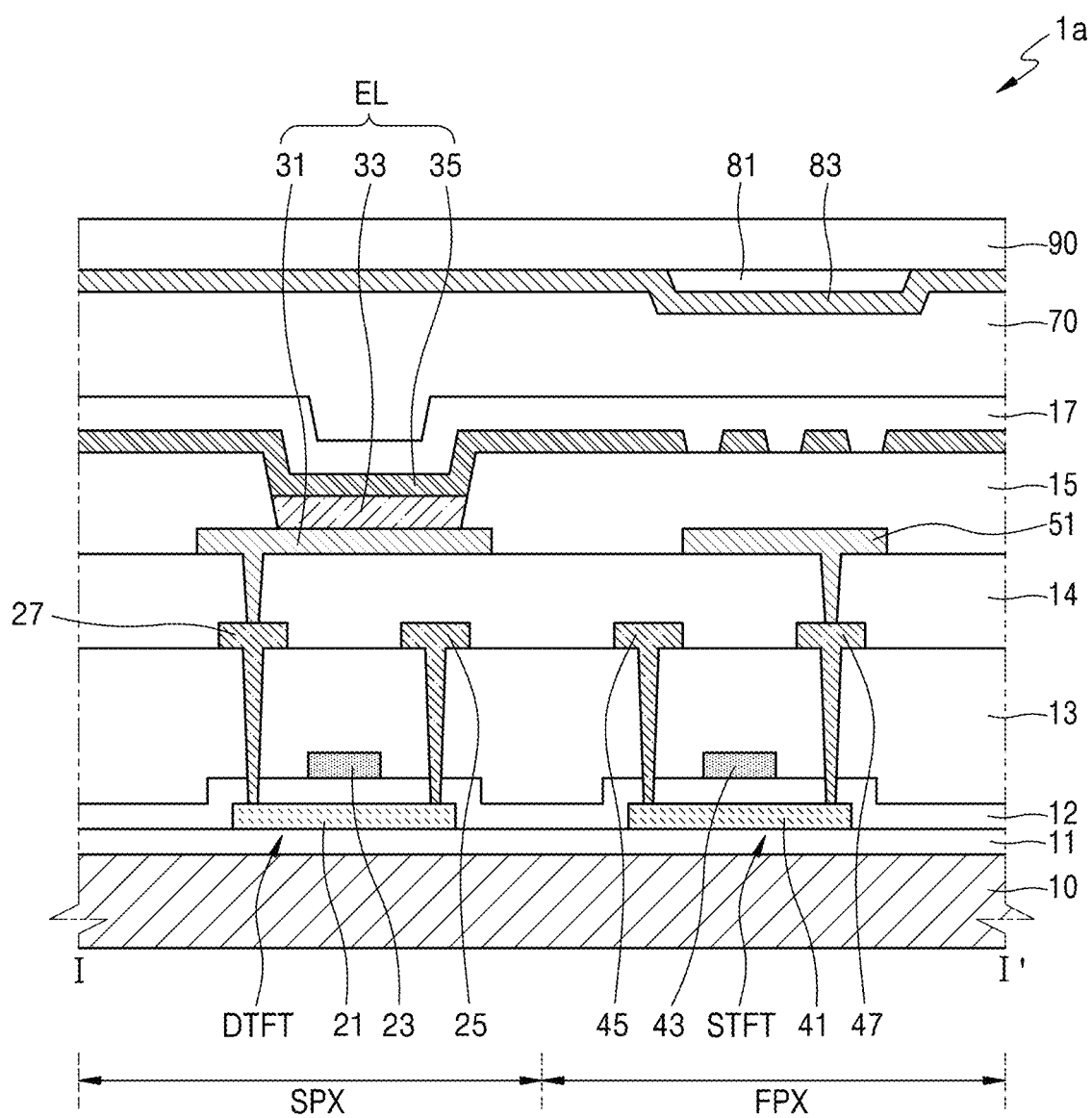
FIG. 5 is a cross-sectional view of an encapsulation substrate arranged on the organic light-emitting display apparatus of FIG. 3.

FIG. 5 is a cross-sectional view of an encapsulation substrate arranged on the organic light-emitting display apparatus 1a of FIG. 3.

Referring to FIG. 5, a fourth insulating layer 17 may be disposed on the second electrode 35 of the organic light-emitting display apparatus 1a. The fourth insulating layer 17 may include a single-layered or multi-layered inorganic insulating layer or a single-layered or multi-layered organic insulating layer, or may have a structure in which the inorganic and organic insulating layers are alternately stacked or disposed. The fourth insulating layer 17 may function as a capping layer and/or a protective layer.

A black matrix 81 may be disposed on a surface of an encapsulation substrate 90 facing the substrate 10, at a location corresponding to a remaining region except for the first electrodes 31. The black matrix 81 may be disposed on a surface of the encapsulation substrate 90. In an alternative embodiment, the black matrix 81 may be disposed in a recess of the encapsulation substrate 90.

An insulating layer 83 may be disposed under the encapsulation substrate 90, e.g., on an entire lower surface of the encapsulation substrate 90. The insulating layer 83 may include an inorganic material layer.

A layer 70 including a moisture absorbent or a filler may be disposed between the substrate 10 and the encapsulation substrate 90, e.g., between the fourth insulating layer 17 and the insulating layer 83.

Figure 6:
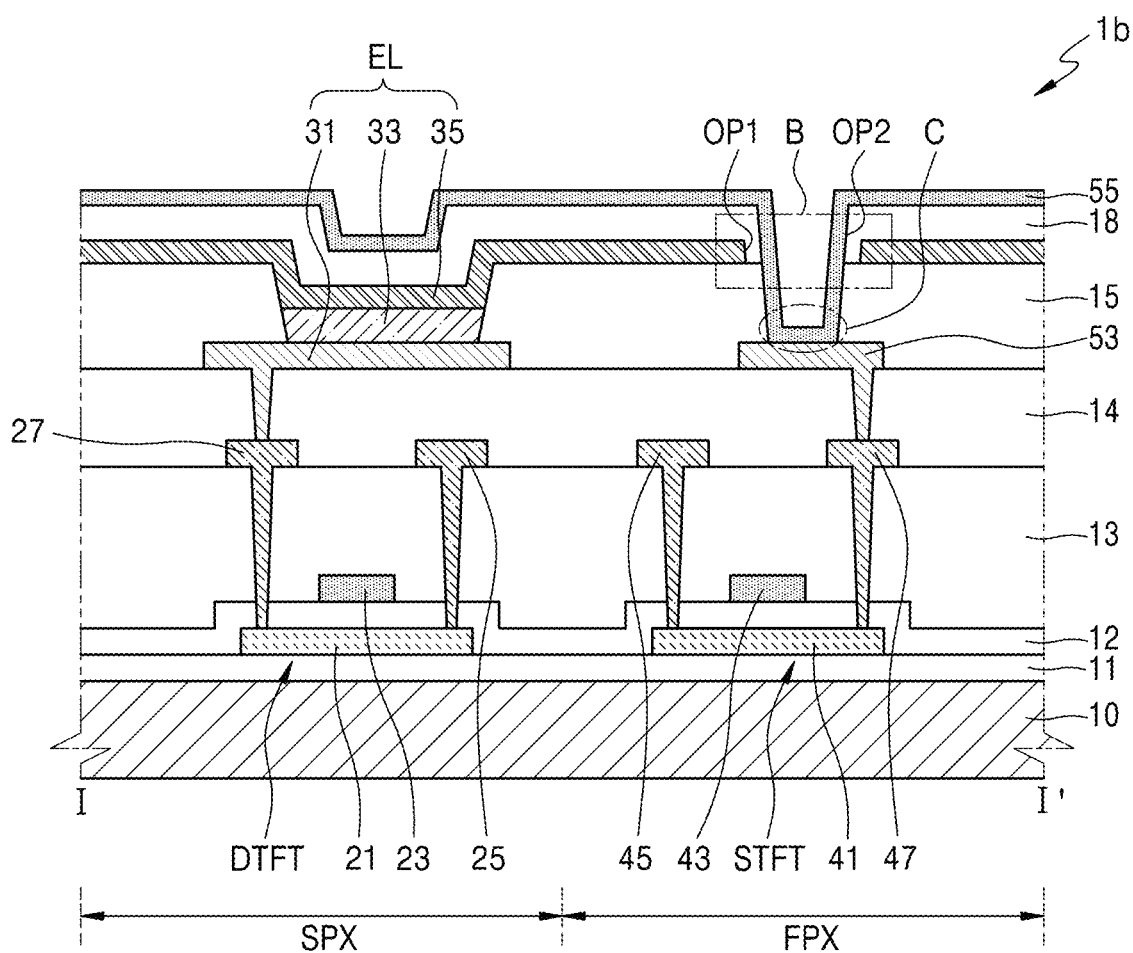
FIG. 6 is a cross-sectional view showing an organic light-emitting display apparatus according to an alternative embodiment.

FIG. 6 is a cross-sectional view showing an organic light-emitting display apparatus according to an alternative embodiment. Particularly, FIG. 6 shows a portion of an organic light-emitting display apparatus corresponding to that shown in FIG. 3.

Referring to FIG. 6, an alternative embodiment of an organic light-emitting display apparatus 1b may include a first area on which sub-pixels SPX are disposed and a second area on which sensing pixels FPX are disposed. The organic light-emitting display apparatus 1b of FIG. 6 may be substantially the same as the organic light-emitting display apparatus 1a of FIG. 3, except for arrangement of the sensing electrode. Therefore, any repetitive detailed description of the same or like elements thereof will be omitted.

In such an embodiment, the sub-pixels SPX, each of which includes a pixel circuit including a thin film transistor DTFT and a light-emitting device EL connected to the pixel circuit, may be disposed in the first area on a substrate 10. The pixel circuit may further include a capacitor.

The sensing pixel FPX including a sensing circuit including a sensing thin film transistor STFT and a sensing electrode 55 may be disposed in the second area on the substrate 10. The sensing circuit may further include at least one capacitor.

The sensing thin film transistor STFT includes an active layer 41, a gate electrode 43, a source electrode 45, and a drain electrode 47. The source electrode 45 and the drain electrode 47 are electrically connected to a source region and a drain region of the active layer 41, respectively.

The sensing electrode 55 may be electrically connected to the sensing thin film transistor STFT via a connecting electrode 53.

The connecting electrode 53 is disposed on the third insulating layer 14, and is electrically connected to the source electrode 45 or the drain electrode 47 (e.g., the drain electrode 47 as shown in FIG. 6). The connecting electrode 53 is covered by the pixel-defining layer 15. The connecting electrode 53 does not overlap with the first electrode 31 of the sub-pixel SPX when viewed from the plan view in the thickness direction of the substrate 10, and may be in a form of an independent island around the first electrode 31.

The second electrode 35 located above the connecting electrode 53 may include a pattern area B in which a first opening OP1 partially exposing the pixel-defining layer 15 is defined. In such an embodiment, as shown in FIG. 6, a single opening OP1 is defined in each pattern area B, but embodiments are not limited thereto. Alternatively, a plurality of openings OP1 may be defined in each pattern area B.

In such an embodiment, a fifth insulating layer 18 may be disposed on the second electrode 35 of the sub-pixel SPX.

A second opening OP2 partially exposing the connecting electrode 53 may be defined, e.g., formed by patterning the fifth insulating layer 18 and the pixel-defining layer 15 at a portion of the second electrode 35, which corresponds to the first opening OP1 of the pattern area B.

The sensing electrode 55 is disposed to cover a predetermined region on the fifth insulating layer 18, and the sensing electrode 55 may cover side surfaces of the second opening OP2 and an upper portion of the connecting electrode 53, which is exposed via the second opening OP2. Accordingly, in such an embodiment, the sensing electrode 55 may contact the connecting electrode 53, and may be electrically connected to the sensing thin film transistor STFT.

In such an embodiment, as shown in FIG. 6, the organic light-emitting display apparatus 1b includes the sensing electrode 55 of a greater area and the variable capacitor between the finger and the sensing electrode 55 is formed above the second electrode 35, and accordingly, influence of the second electrode 35 may be reduced and fingerprint sensing efficiency may be improved.

Figure 7:
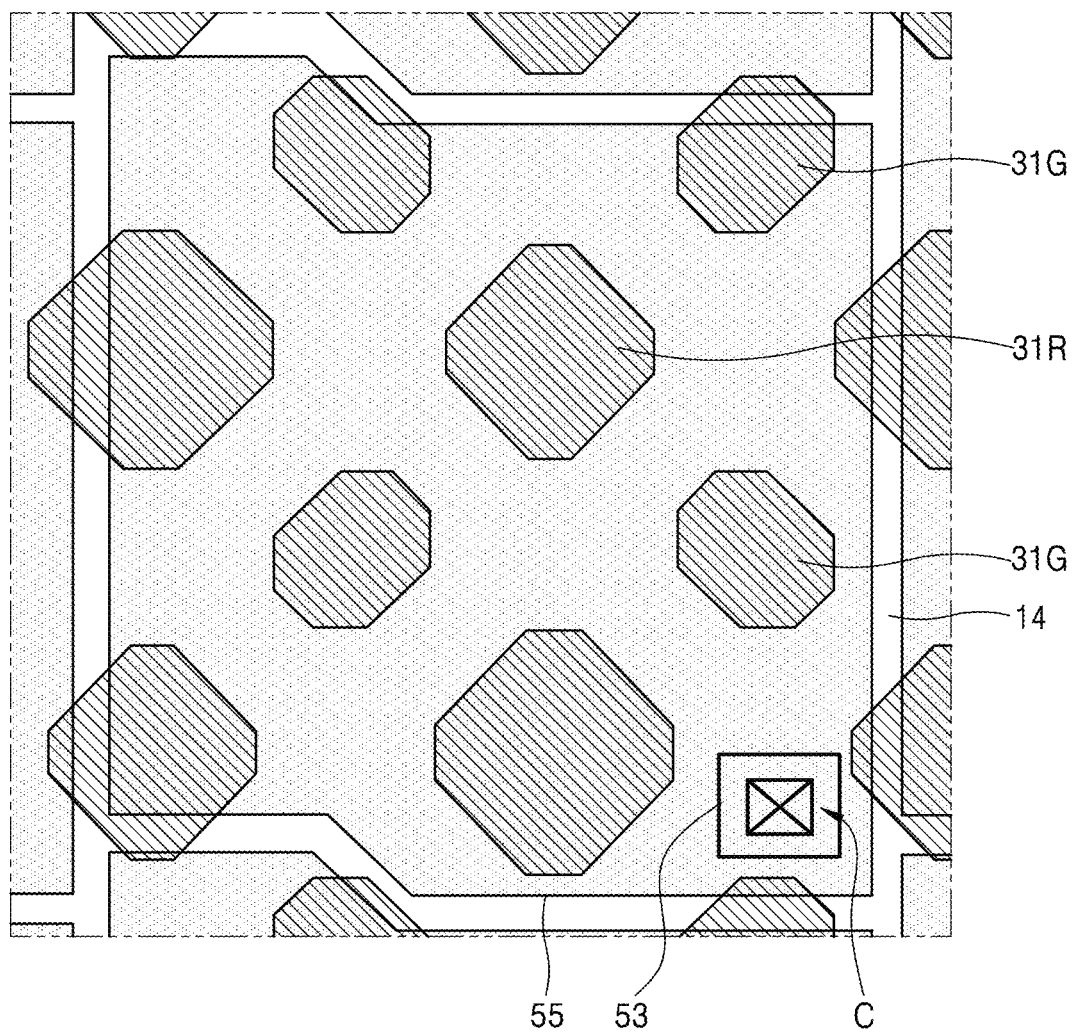
FIG. 7 is a plan view showing an arrangement of a first electrode of a sub-pixel and a sensing electrode of a sensing pixel shown in FIG. 6.

FIG. 7 is a plan view showing arrangement of the first electrode 31 of the sub-pixel SPX and the sensing electrode 55 of the sensing pixel FPX of FIG. 6.

Referring to FIG. 7, the first electrode 31 is disposed in each sub-pixel SPX on the third insulating layer 14, and the connecting electrode 53 may be disposed at a side of the first electrodes 31 (e.g., 31R, 31B, and 31G) of the plurality of sub-pixels SPX.

The first electrode 31 may have a size corresponding to that of the sub-pixel shown in FIG. 1. In one embodiment, for example, a first electrode 31R of a first sub-pixel SPX1, a first electrode 31B of a second sub-pixel SPX2, and a first electrode 31G of a third sub-pixel SPX3 may have different sizes from one another.

The sensing electrode 55 is disposed on upper portions of the first electrodes 31 of the plurality of sub-pixels SPX, and may be connected to the connecting electrode 53 at a contact portion C. In FIG. 7, for convenience of illustration, the pixel-defining layer 15 on the connecting electrode 53, the second electrode 35 of the light-emitting device EL, and the fifth insulating layer 18 are omitted. The sensing electrode 55 may have an area that is enough to cover the plurality of first electrodes 31, and may have a square-like shape.

The sensing electrode 55 of the organic light-emitting display apparatus 1b may be sealed by an encapsulation member thereon.

In one embodiment, for example, the encapsulation member may be an encapsulation thin film. The encapsulation member may include a film including an inorganic material such as silicon oxide or silicon nitride, or may have a structure in which an inorganic layer and a layer including an organic material such as epoxy or polyimide are alternately stacked one on another.

In alternative embodiment, the encapsulation member may be an encapsulation substrate.

Figure 8:
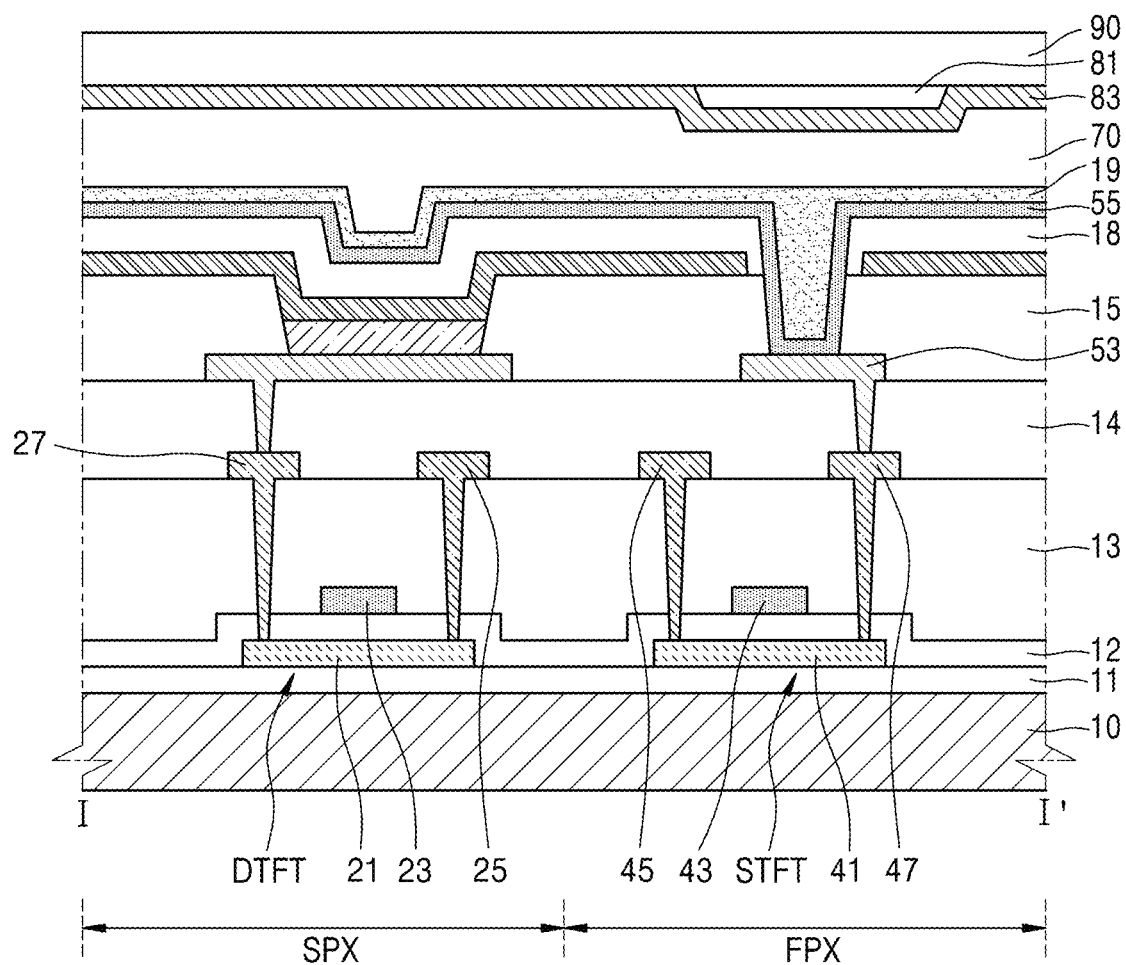
FIG. 8 is a cross-sectional view of an encapsulation substrate arranged on the organic light-emitting display apparatus of FIG. 6.

FIG. 8 is a cross-sectional view of an encapsulation substrate arranged on the organic light-emitting display apparatus 1b of FIG. 6.

Referring to FIG. 8, a sixth insulating layer 19 may be disposed on the sensing electrode 55 of the organic light-emitting display apparatus 1b. The sixth insulating layer 19 may include a single-layered or multi-layered inorganic insulating layer, or a single-layered or multi-layered organic insulating layer, or may have a structure in which the inorganic and organic insulating layers are alternately arranged. The sixth insulating layer 19 may function as a capping layer and a protective layer.

A black matrix 81 may be disposed on a surface of an encapsulation substrate 90 facing the substrate 10, e.g., a lower surface of the encapsulation substrate 90, at a location corresponding to a remaining region except for the first electrodes 31. The black matrix 81 may be disposed on a surface of the encapsulation substrate 90. In an alternative embodiment, the black matrix 81 may be disposed in a recess of the encapsulation substrate 90.

An insulating layer 83 may be disposed under the encapsulation substrate 90, e.g., on the entire lower surface of the encapsulation substrate 90. The insulating layer 83 may include an inorganic material layer.

A layer 70 including a moisture absorbent or a filler may be disposed between the substrate 10 and the encapsulation substrate 90, e.g., between the fifth insulating layer 18 and the insulating layer 83.

The cross-sectional views of FIGS. 3 to 8 show exemplary embodiments of the invention, and although the arrangement of the first electrode of the light-emitting device and the sensing electrode of the sensing circuit may be uniform, connections and arrangement of the other circuit devices may be variously modified based on configurations of the pixel circuit and the sensing circuit.

Figure 9:
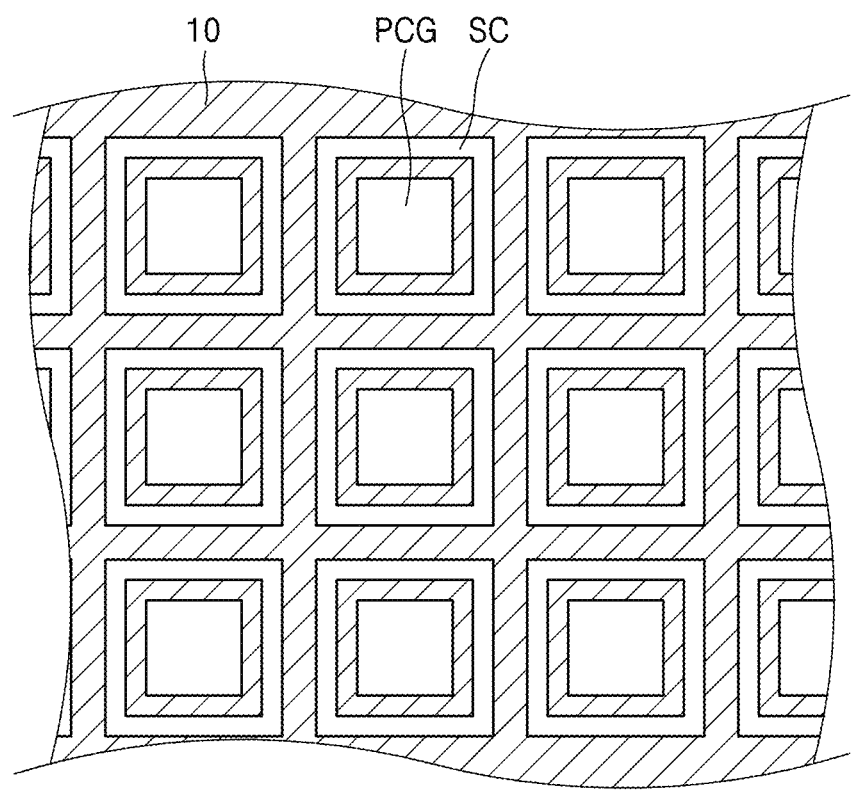
FIG. 9 is a plan view showing an arrangement of a pixel circuit and a sensing circuit of an organic light-emitting display apparatus according to an embodiment of the disclosure.

FIG. 9 is a plan view showing arrangement of a pixel circuit and a sensing circuit of an organic light-emitting display apparatus 1 according to an embodiment of the disclosure.

Referring to FIG. 9, pixel circuits of a pixel group including the predetermined number of pixels PX (PCG, hereinafter, referred to as 'pixel circuit group') and the sensing circuit SC of the sensing pixel FPX may be repeatedly arranged on the substrate 10 of the organic light-emitting display apparatus 1 in row and column directions.

The pixel group may include at least one pixel PX, and the pixel circuits in the pixel circuit group PCG may have a symmetric structure at least in a transverse direction. In one embodiment, for example, the pixel circuits in the pixel circuit group PCG may have a symmetric structure in both longitudinal and transverse directions.

The sensing circuit SC may be disposed along a peripheral portion of the pixel circuit group PCG. In such an embodiment, a thin film transistor and a capacitor included in the sensing circuit SC may be appropriately distributed around the pixel circuit group PCG.

The pixel circuit group PCG may include pixel circuits PC of N×N pixels PX. The pixel circuits PC in the pixel circuit group PCG may be disposed in a predetermined arrangement so that a parasitic capacitor among the pixels is the minimum.

In one embodiment, for example, when N is an even number, circuit devices may be arranged in a way such that the pixel circuits PC may be symmetric with one another in longitudinal and transverse directions in units of four pixel circuits PC. In one alternative embodiment, for example, when N is an odd number, the circuit devices may be arranged in a way such that the pixel circuits PC may be symmetric with each other in units of two pixel circuits PC.

According to an embodiment of the disclosure, a plurality of pixels is packed to ensure space, and the sensor is arranged in the ensured space to effectively control the capacitance of the sensor. In such an embodiment, the pixel circuits of the pack pixels are arranged to be symmetric in the transverse direction or in the longitudinal and transverse directions, and thus, the parasitic capacitor among the pixels are similar to one another, and thereby improving a mura defect.

FIGS. 10A to 10D are diagrams showing various embodiments of a pixel circuit group PCG.

Figure 10A:
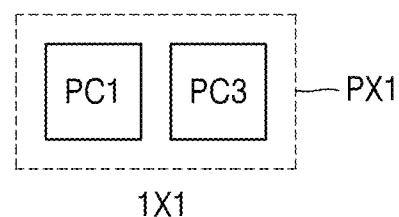
FIGS. 10A to 10D are diagrams showing various embodiments of a pixel circuit group.

In an embodiment, as shown in FIG. 10A, the pixel circuit group PCG may include pixel circuits of 1×1 pixel PX (e.g., one pixel or two sub-pixels). The pixels PX may include a first pixel PX1 or a second pixel PX2. A pair of pixel circuits PC1 and PC3 of the pixel circuit group PCG has a symmetric structure in the transverse direction.

Figure 10B:
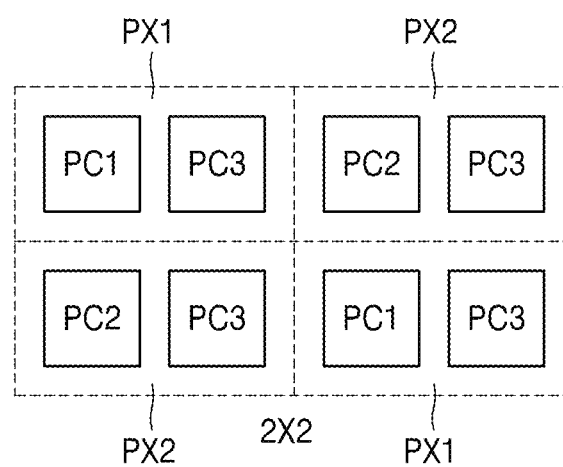

In an alternative embodiment, as shown in FIG. 10B, the pixel circuit group PCG may include pixel circuits PC1-PC3 of 2×2 pixels PX (e.g., four pixels or eight sub-pixels). The four pixels PX may include two first pixels PX1 and two second pixels PX2 that are alternately arranged with each other. Each of a pair of pixel circuits PC1 and PC3 of the first pixel PX1 and a pair of pixel circuits PC2 and PC3 of the second pixel PX2 has a symmetric structure in the transverse direction. The pixel circuits PC1 and PC3 of the first pixel PX1 and the pixel circuits PC2 and PC3 of the second pixel PX2 that are arranged above and below each other are symmetric with each other in the longitudinal direction.

Figure 10C:
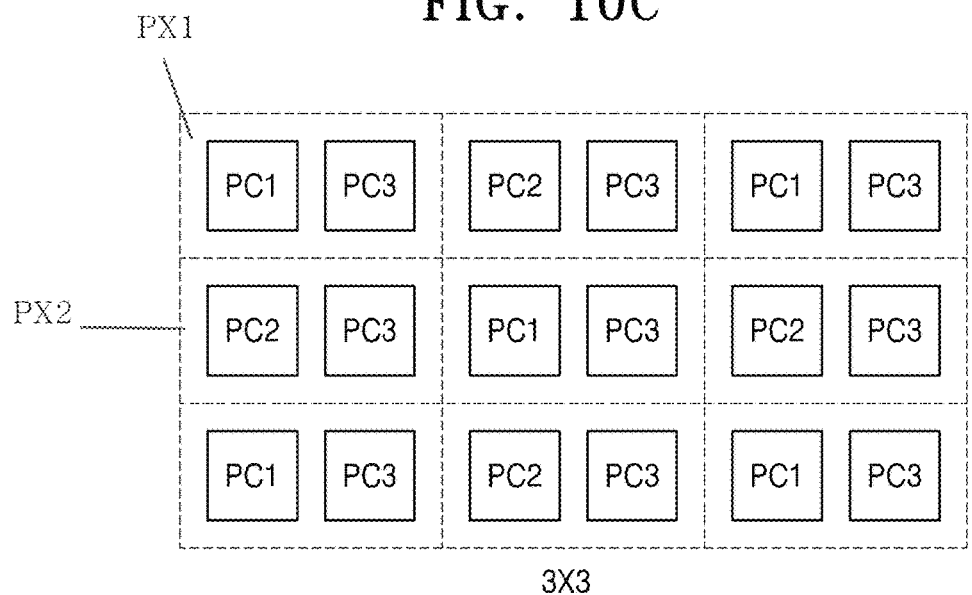

In another alternative embodiment, as shown in FIG. 10C, the pixel circuit group PCG may include pixel circuits PC of 3×3 pixels PX (e.g., nine pixels or eighteen sub-pixels). The nine pixels PX may include five first pixels PX1 and four second pixels PX2 that are alternately arranged with each other. Each of a pair of pixel circuits PC1 and PC3 of the first pixel PX1 and a pair of pixel circuits PC2 and PC3 of the second pixel PX2 has a symmetric structure in the transverse direction.

Figure 10D:
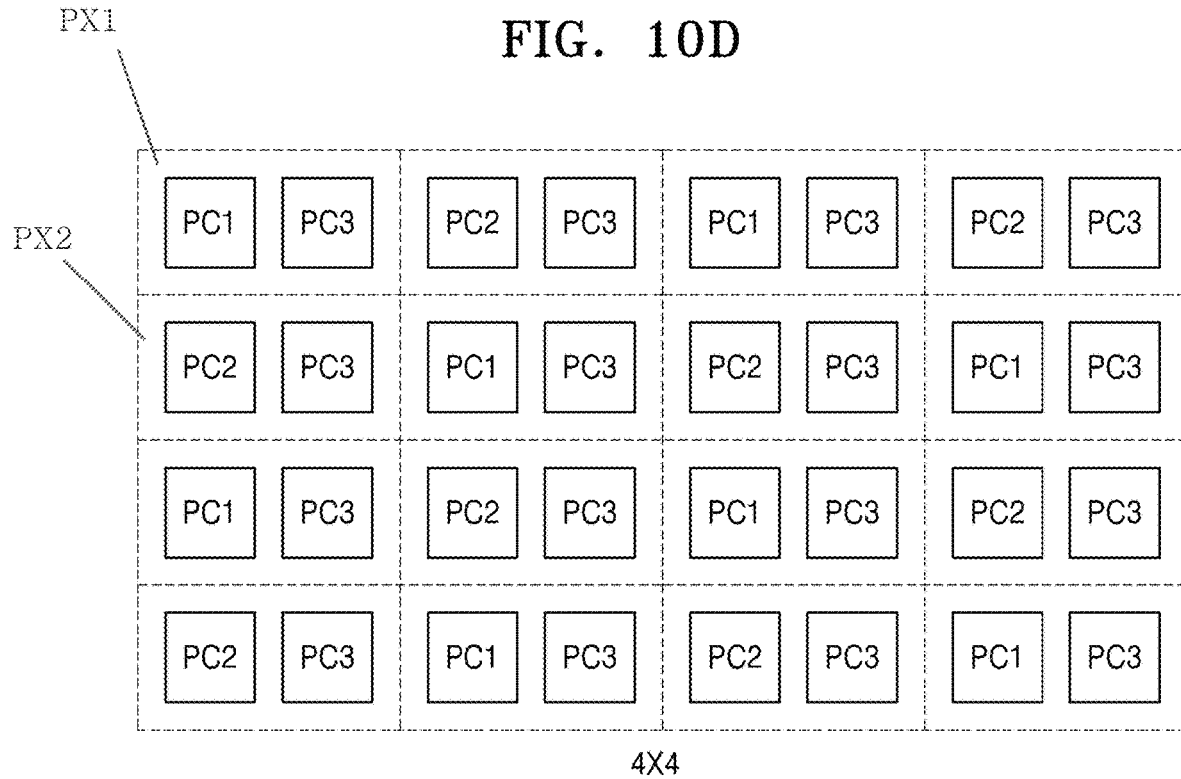

In another alternative embodiment, as shown in FIG. 10D, the pixel circuit group PCG according to the embodiment may include pixel circuits of 4×4 pixels PX (e.g., sixteen (16) pixel or thirty two (32) sub-pixels). The sixteen pixels PX may include eight first pixels PX1 and eight second pixels PX2 that are alternately arranged with each other. Each of a pair of pixel circuits PC1 and PC3 of the first pixel PX1 and a pair of pixel circuits PC2 and PC3 of the second pixel PX2 has a symmetric structure in the transverse direction. The pixel circuits PC1 and PC3 of the first pixel PX1 and the pixel circuits PC2 and PC3 of the second pixel PX2 that are arranged above and below each other are symmetric with each other in the longitudinal direction.

Figure 11:
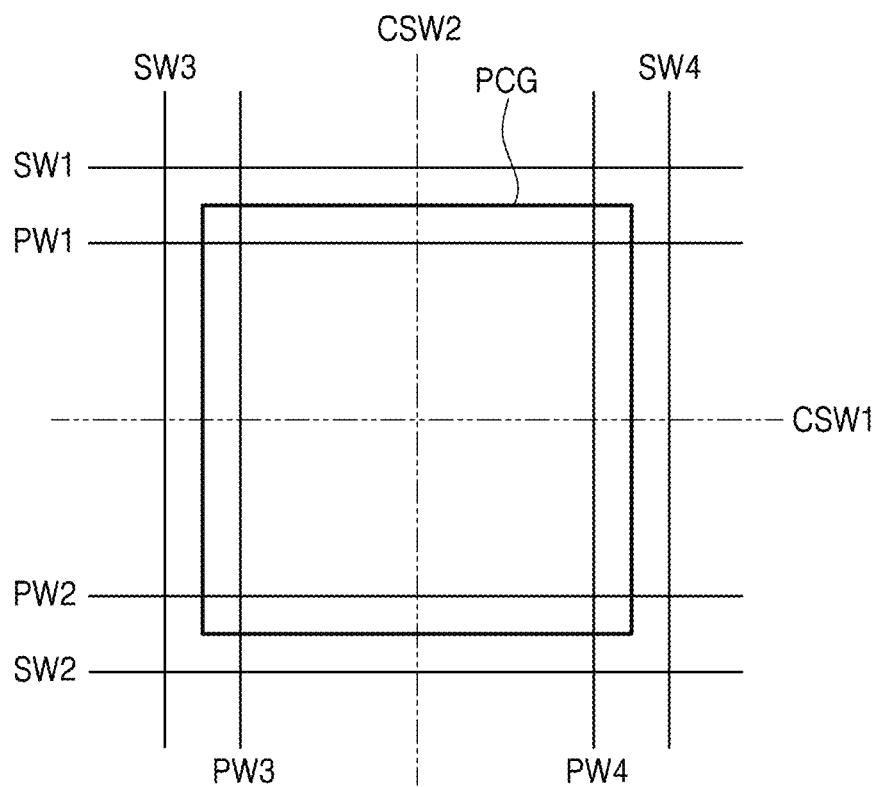
FIG. 11 is a diagram showing wiring in a pixel circuit group, according to an embodiment of the disclosure.

FIG. 11 is a diagram showing wirings of a pixel circuit group PCG according to an embodiment of the disclosure.

Referring to FIG. 11, in an embodiment, a plurality of pixel wirings PW (e.g., PW1 to PW4) are distributed in the pixel circuit group PCG, and a plurality of sensing wirings SW (SW1 to SW4) of the sensing circuit SC may be arranged around the pixel circuit group PCG. In an embodiment having the arrangement of the pixel circuits PC of the pixel circuit group PCG and the arrangement of the pixel wirings PW and the sensing wirings SW as shown in FIG. 11, parasitic capacitor may exist between the pixels. Accordingly, in such an embodiment, a shielding wiring CSW, e.g., first shielding wiring CSW1 and a second shielding wiring CSW2, may be selectively provided at an appropriate location to reduce or shield the parasitic capacitor.

In an embodiment, the shielding wiring CSW may be a floating wiring or a wiring to which a predetermined voltage is applied. Here, the predetermined voltage may be one of voltages applied to the pixel circuit PC or voltages applied to the sensing circuit SC. The shielding wiring CSW may be provided in a same layer as at least one of the pixel wirings PW of the pixel circuit PC and the sensing wirings SW of the sensing circuit SC, and may include a same material as the at least one of the pixel wirings PW of the pixel circuit PC and the sensing wirings SW of the sensing circuit SC.

In such an embodiment, as shown in FIG. 11, first to fourth pixel wirings PW1 to PW4 are arranged at upper, lower, left, and right sides of the pixel circuit group PCG, respectively, and first to fourth sensing wirings SW1 to SW4 of the sensing circuit SC are arranged around the pixel circuit group PCG. In such an embodiment, the first shielding wiring CSW1 and the second shielding wiring CSW2 are arranged to cross a center of the pixel circuit group PCG in a transverse direction and a longitudinal direction, respectively.

In such an embodiment, the numbers and arrangement of the pixel wirings PW, the sensing wirings SW, and the shielding wirings CSW may be variously modified depending on configurations of the pixel circuit PC and the sensing circuit SC to reduce the parasitic capacitor among the pixels.

Figure 12:
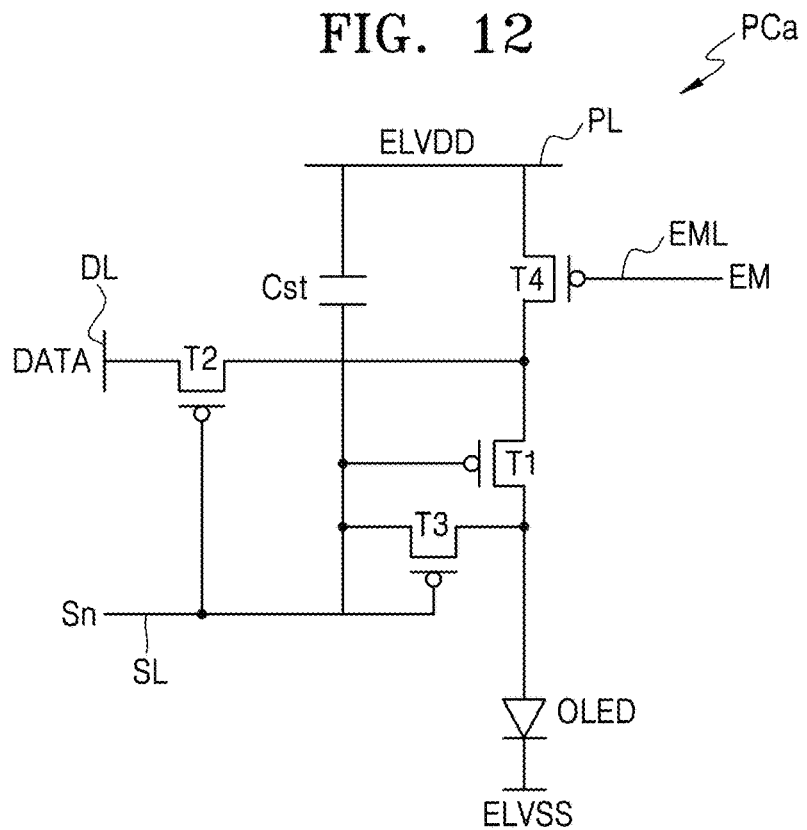
FIG. 12 is a circuit diagram of a pixel circuit in a sub-pixel, according to an embodiment of the disclosure.

FIG. 12 is a circuit diagram of a pixel circuit PCa in a sub-pixel according to an embodiment of the disclosure.

Referring to FIG. 12, an embodiment of the pixel circuit PCa includes first to fourth thin film transistors T1 to T4, and a capacitor Cst. The pixel circuit PCa is connected to the light-emitting device. The light-emitting device may be an organic light-emitting diode OLED.

In such an embodiment, a gate electrode of the first thin film transistor T1 is connected to a first electrode of the capacitor Cst. A first electrode of the first thin film transistor T1 is connected to a driving voltage line PL that applies a first power voltage ELVDD thereto via the fourth thin film transistor T4. A second electrode of the first thin film transistor T1 is electrically connected to a first electrode of the organic light-emitting diode OLED. The first thin film transistor T1 receives a data signal DATA according to a switching operation of the second thin film transistor T2, and supplies a driving current to the organic light-emitting diode OLED.

In such an embodiment, a gate electrode of the second thin film transistor T2 is connected to a scan line SL that applies a scan signal Sn. A first electrode of the second thin film transistor T2 is connected to a data line DL that applies a data signal DATA thereto. A second electrode of the second thin film transistor T2 is connected to the first electrode of the first thin film transistor T1, and thus, is connected to the driving voltage line PL via the fourth thin film transistor T4. The second thin film transistor T2 is turned on in response to the scan signal Sn transmitted through the scan line SL, and then, performs a switching operation for transferring the data signal DATA transmitted through the data line DL to the first electrode of the first thin film transistor T1.

In such an embodiment, a gate electrode of the third thin film transistor T3 is connected to the scan line SL. A first electrode of the third thin film transistor T3 is connected to the second electrode of the first thin film transistor T1, to be connected to the first electrode of the organic light-emitting diode OLED. The second electrode of the third thin film transistor T3 is connected to a first electrode of the capacitor Cst and the gate electrode of the first thin film transistor T1. The third thin film transistor T3 is turned on in response to the scan signal Sn transmitted through the scan line SL, and connects the gate electrode and the second electrode of the first thin film transistor T1 to diode-connect the first thin film transistor T1.

The gate electrode of the fourth thin film transistor T4 is connected to an emission control line EML that applies an emission control signal EM. A first electrode of the fourth thin film transistor T4 is connected to the driving voltage line PL. A second electrode of the fourth thin film transistor T4 is connected to the first electrode of the first thin film transistor T1 and the second electrode of the second thin film transistor T2.

The second electrode of the capacitor Cst is connected to the driving voltage line PL. The first electrode of the capacitor Cst is connected to the gate electrode of the first thin film transistor T1 and the second electrode of the third thin film transistor T3.

The first electrode of the organic light-emitting diode OLED is connected to the second electrode of the first thin film transistor T1, and the second electrode of the organic light-emitting diode OLED is connected to a power source supplying a second power voltage ELVSS. The organic light-emitting diode OLED receives the driving current from the first thin film transistor T1 to emit light, and thus displays images.

Figure 13:
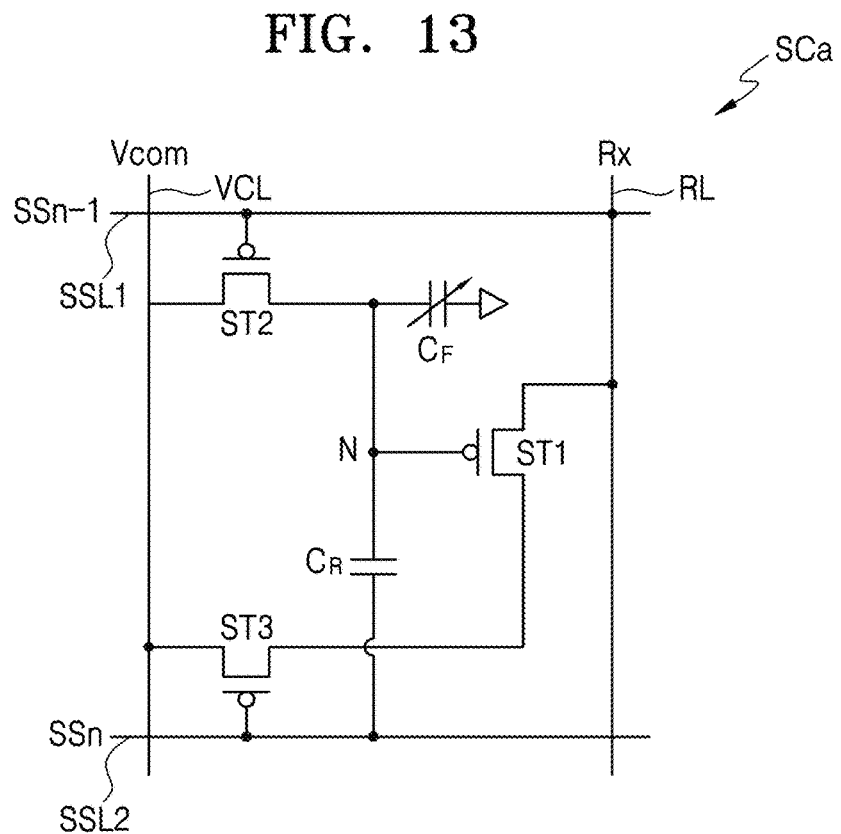
FIG. 13 is a circuit diagram of a sensing circuit in a sensing pixel, according to an embodiment of the disclosure.

FIG. 13 is a circuit diagram of a sensing circuit SCa in a sensing pixel according to an embodiment of the disclosure.

Referring to FIG. 13, an embodiment of the sensing circuit SCa may include a first to third sensing thin film transistors ST1 to ST3, and a reference capacitor $C_R$. A sensing electrode that forms a sensing capacitor $C_F$ may be connected to the reference capacitor $C_R$.

In such an embodiment, a gate electrode of the first sensing thin film transistor ST1 is connected to a node N. A first electrode of the first sensing thin film transistor ST1 is connected to a readout line RL to a readout signal Rx is applied, and a second electrode of the first sensing thin film transistor ST1 is connected to a second electrode of the third sensing thin film transistor ST3.

A gate electrode of the second sensing thin film transistor ST2 is connected to a first sensing scan line SSL1 that applies a first sensing scan signal SSn−1. A first electrode of the second sensing thin film transistor ST2 is connected to a common voltage line VCL that applies a common voltage Vcom, and a second electrode of the second sensing thin film transistor ST2 is connected to the node N.

A gate electrode of the third sensing thin film transistor ST3 is connected to a second sensing scan line SSL2 that applies a second sensing scan signal SSn. A first electrode of the third sensing thin film transistor ST3 is connected to the common voltage line VCL that applies the common voltage Vcom, and the second electrode of the third sensing thin film transistor ST3 is connected to the second electrode of the first sensing thin film transistor ST1.

A first electrode of the reference capacitor $C_R$ is connected to the second sensing scan line SSL2 and a gate electrode of the third sensing thin film transistor ST3. A second electrode of the reference capacitor $C_R$ is connected to the node N to be connected to the gate electrode of the first sensing thin film transistor ST1.

The sensing capacitor $C_F$ is a variable capacitor formed by the sensing electrode and a surface of a finger. The sensing electrode of the sensing capacitor $C_F$ is connected to the node N to be connected to the gate electrode of the first sensing thin film transistor ST1, the second electrode of the second sensing thin film transistor ST2, and the second electrode of the reference capacitor $C_R$.

In an embodiment, the second sensing thin film transistor ST2 is turned on in response to the first sensing scan signal SSn−1, and may reset the gate electrode of the first thin film transistor ST1 connected to the node N by using the common voltage Vcom applied thereto. In such an embodiment, the third sensing thin film transistor ST3 is turned on in response to the second sensing scan signal SSn and then, the common voltage Vcom is applied to the first electrode of the reference capacitor $C_R$. Here, due to the coupling of a capacitance of the sensing capacitor CF and a capacitance of the reference capacitor $C_R$ in the ridges and valleys of a fingerprint, a voltage at the node N, that is, a voltage of the gate electrode of the first sensing thin film transistor ST1 changes. Accordingly, the fingerprint may be recognized via the variation in an amount of a current flowing in the first sensing thin film transistor ST1.

Figure 14:
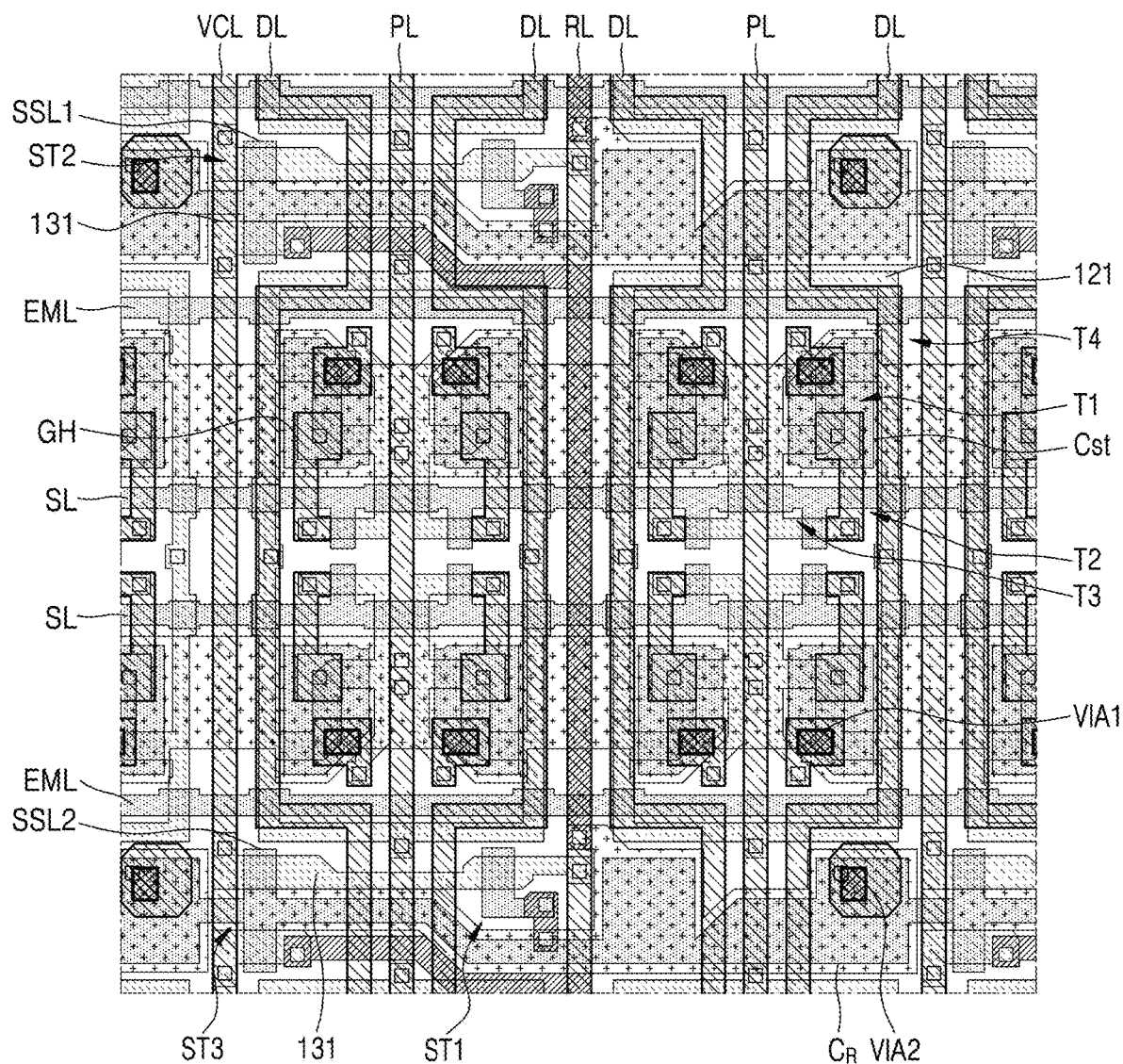
FIG. 14 is a plan view of an organic light-emitting display apparatus, showing an arrangement of the pixel circuit of FIG. 12 and the sensing circuit of FIG. 13, according to an embodiment of the disclosure.

FIG. 14 is a plan view of an organic light-emitting display apparatus, showing arrangement of the pixel circuit PCa of FIG. 12 and the sensing circuit SCa of FIG. 13, according to an embodiment of the disclosure.

Referring to FIG. 14, in an embodiment, the sensing circuit SCa is arranged to surround the pixel circuit group PCG in which the pixel circuits PCa of 2×2 pixels are arranged symmetrically with each other in longitudinal and transverse directions.

The scan line SL and the emission control line EML of the pixel circuit PCa and the first sensing scan line SSL1 and the second sensing scan line SSL2 of the sensing circuit SCa are spaced apart from one another, and extend in a row direction. The driving voltage line PL and the data line DL of the pixel circuit PCa and the common voltage line VCL and the readout line RL of the sensing circuit SCa are spaced apart from one another and extend in a column direction.

In an embodiment, the first electrode and the second electrode of each thin film transistor in the pixel circuit PCa and the sensing circuit SCa shown in FIGS. 12 and 13 respectively correspond to a source region and a drain region doped with impurities in the active layers 121 and 131.

The first to fourth thin film transistor T1 to T4 of the pixel circuit PCa are arranged along the active layer 121. The active layer 121 includes polysilicon, and the active layer 121 includes a channel region that is not doped with impurities, and the source region and the drain region doped with impurities at opposite sides of the channel region. Here, the impurities may vary depending on a kind of the thin film transistor, and may be N-type impurities or P-type impurities.

The first thin film transistor T1 includes the active layer 121 that is curved as S-like shape. The first thin film transistor T1 and the capacitor Cst overlap each other in a vertical direction.

The first electrode of the capacitor Cst also functions as the gate electrode of the first thin film transistor T1. The first electrode of the capacitor Cst is separated from an adjacent sub-pixel and has a square shape. The second electrode of the capacitor Cst extends to be connected to an adjacent pixel. An opening GH is defined through the second electrode of the capacitor Cst so that the connecting electrode connects the gate electrode of the first thin film transistor T1 to the second electrode of the third thin film transistor T3 via the opening GH.

The driving voltage line PL crosses a center between a pair of pixel circuits PCa in the column direction, and is connected to the second electrode of the capacitor Cst extending in the row direction to have a mesh structure. The data lines DL of the pair of pixel circuits PCa are arranged to face each other as the driving voltage line PL is interposed therebetween.

The second sensing thin film transistor ST2 of the sensing circuit SCa are arranged at an upper left portion of the pixel circuit PCa of 2×2 pixels, and the first sensing thin film transistor ST1 and the third sensing thin film transistor ST3 are arranged at a lower portion of the pixel circuit PCa of 2×2 pixels, when viewed from a plan view in a thickness direction of the substrate 10.

The common voltage line VCL is arranged at a left portion of the pixel circuits PCa of 2×2 pixels in the column direction, when viewed from the plan view. The common voltage line VCL is arranged on an outer portion of the data line DL, when viewed from the plan view. The readout line RL is arranged in the column direction across centers of the pixel circuits PCa of 2×2 pixels. The readout line RL is arranged between opposite data lines DL. The first sensing scan line SSL1 and the second sensing scan lien SSL2 are arranged on an outer portion of the emission control line EML, when viewed from the plan view.

The first electrode and the second electrode of the reference capacitor CR are arranged to overlap each other in the row direction at a lower portion of the first sensing thin film transistor ST1 and the third sensing thin film transistor ST3, when viewed from the plan view.

In such an embodiment, a first via hole VIA1 for connecting the second electrode of the first thin film transistor T1 to the first electrode of the light-emitting device is defined through each pixel circuit PC. In such an embodiment, a second via hole VIA2 for connecting the sensing electrode of the sensing capacitor $C_F$ to the second electrode of the reference capacitor CR is defined through the sensing circuit SCa.

Figure 15:
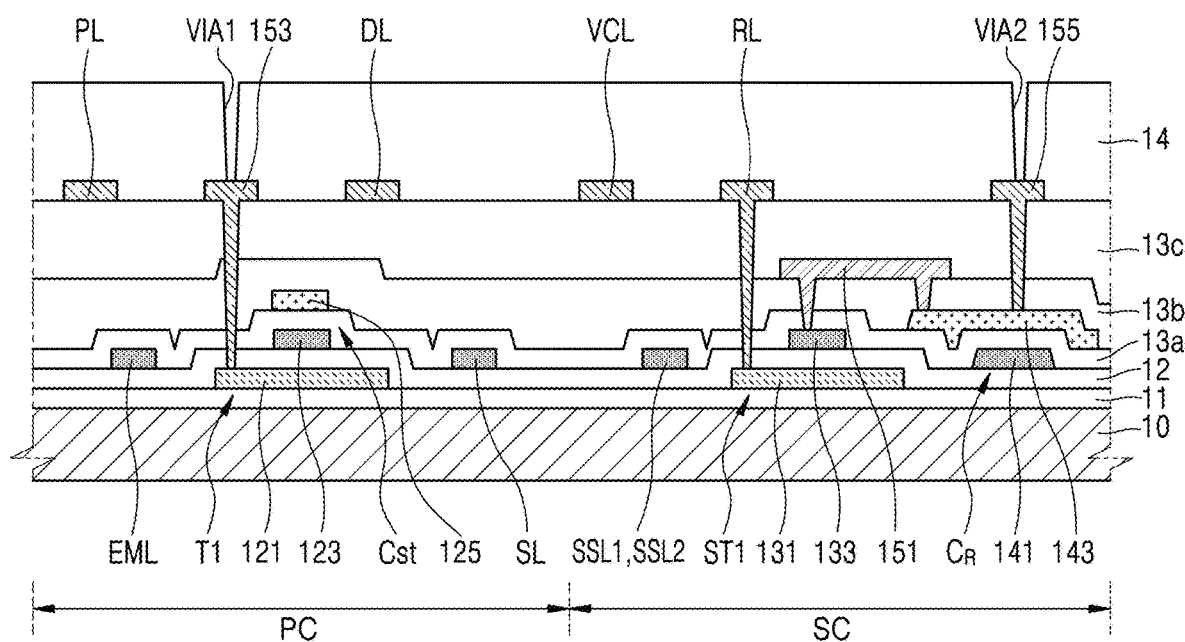
FIGS. 15 to 17 are partial cross-sectional views showing embodiments of the organic light-emitting display apparatus of FIG. 14.
Figure 16:
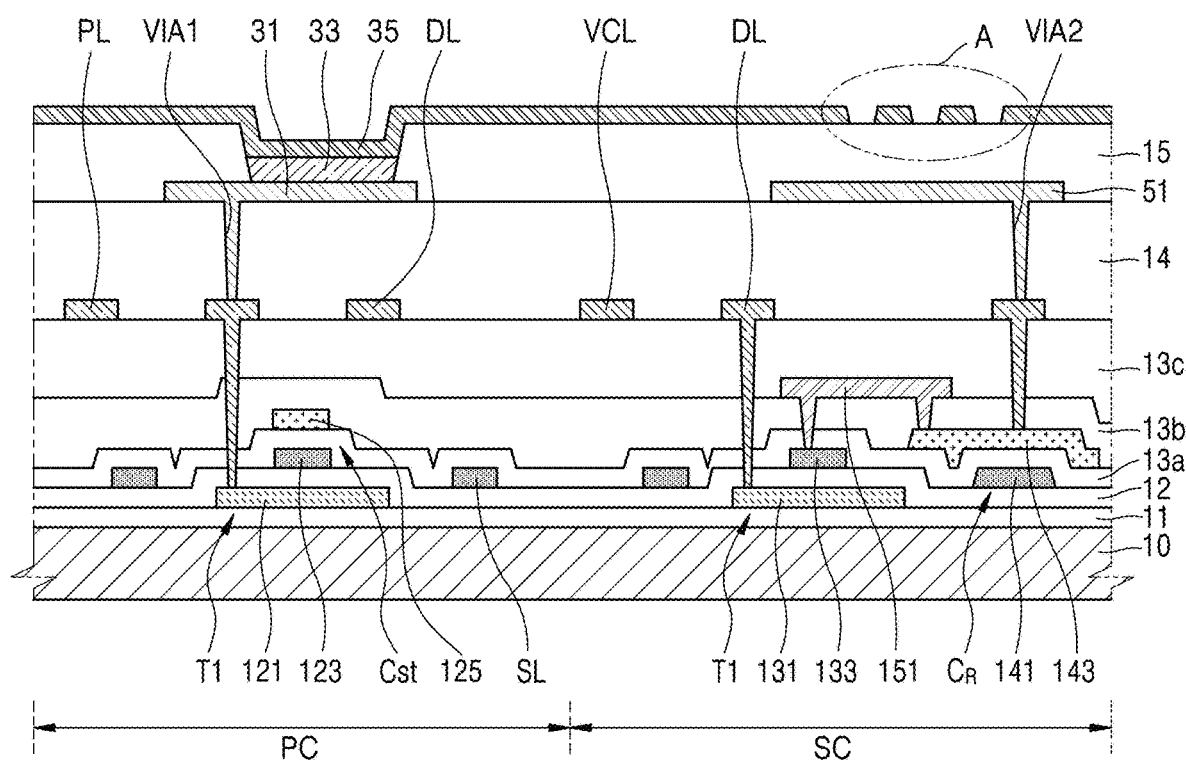
Figure 17:
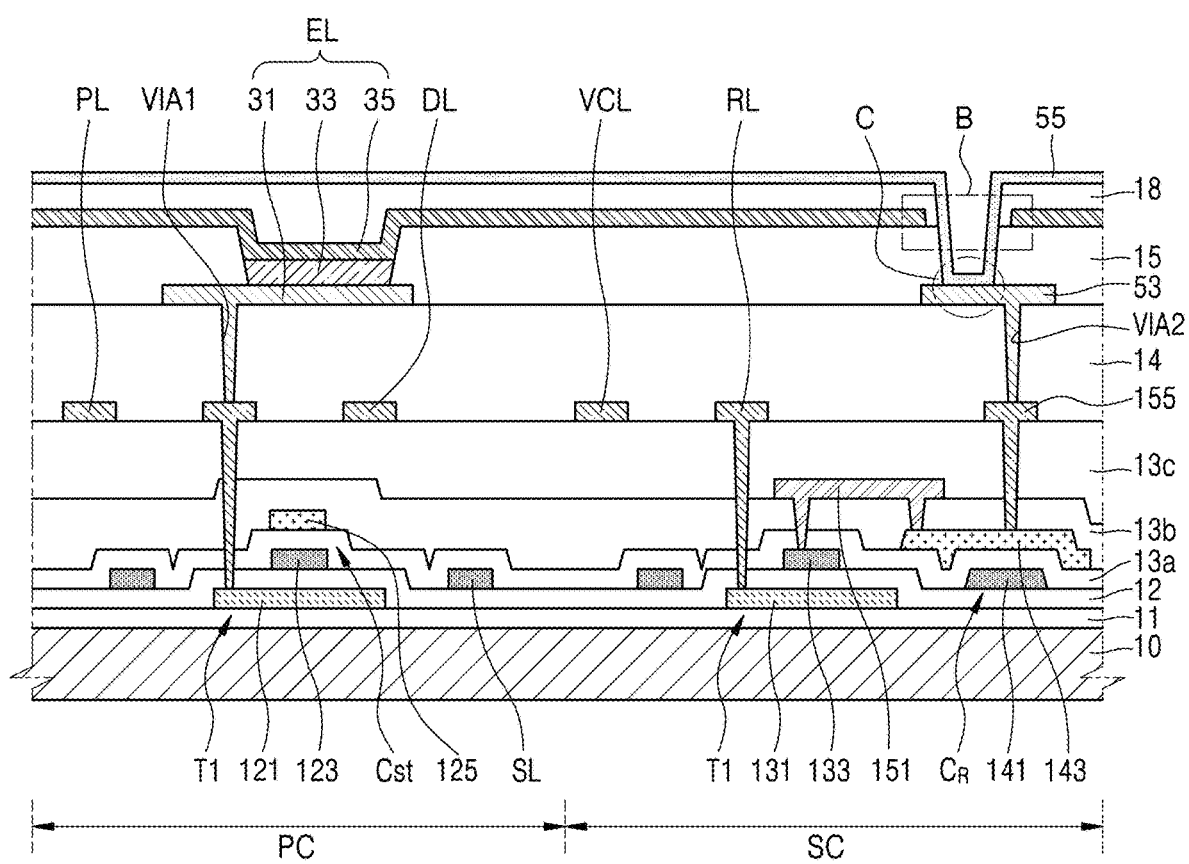

FIGS. 15 to 17 are partial cross-sectional views showing embodiments of the organic light-emitting display apparatus of FIG. 14.

FIG. 15 is a cross-sectional view showing the first thin film transistor T1 and the capacitor Cst of the pixel circuit PCa and the first sensing thin film transistor ST1 and the reference capacitor $C_R$ of the sensing circuit SCa in an embodiment of the organic light-emitting display apparatus. Hereinafter, embodiments of the organic light-emitting display apparatus will be described with reference to FIGS. 15 to 17 and also with reference to FIG. 14.

In an embodiment, as shown in FIG. 15, the buffer layer 11 is arranged on the substrate 10.

Active layers 121 of the first to fourth thin film transistor T1 to T4 and active layers 131 of the first to third sensing thin film transistor ST1 to ST3 are disposed on the buffer layer 11. FIG. 15 shows the active layer 121 of the first thin film transistor T1 and the active layer 131 of the first sensing thin film transistor ST1.

The active layers 121 of the first to fourth thin film transistor T1 to T4 are connected to one another. The active layers 131 of the first and third sensing thin film transistors ST1 and ST3 are connected to one another, and the active layer 131 of the second sensing thin film transistor ST2 is isolated.

The first insulating layer 12 is disposed on the active layers 121 and 131.

The gate electrodes of the first to fourth thin film transistors T1 to T4, the gate electrodes of the first to third sensing thin film transistors ST1 to ST3, and a first electrode 141 of the reference capacitor $C_R$ are disposed on the first insulating layer 12. FIG. 15 shows the gate electrode 123 of the first thin film transistor T1, the gate electrode 133 of the first sensing thin film transistor ST1, and the first electrode 141 of the reference capacitor $C_R$. The gate electrode 123 of the first thin film transistor T1 also functions as the first electrode of the capacitor Cst.

The emission control line EML, the scan line SL, and the first and second sensing scan lines SSL1 and SSL2 may be arranged at the same layer as those of the gate electrodes 123 and 133.

The second insulating layer includes a first second insulating layer 13a, a second second insulating layer 13b and a third second insulating layer 13c. The first second insulating layer 13a is disposed on the gate electrodes 123 and 133 and the first electrode 141. The second electrode 125 of the capacitor Cst and the second electrode 143 of the reference capacitor $C_R$ are disposed on the first second insulating layer 13a. The second second insulating layer 13b is disposed on the second electrodes 125 and 143. A connecting electrode 151 for connecting the gate electrode 133 of the first sensing thin film transistor ST1 to the second electrode 143 of the reference capacitor $C_R$ is disposed on the second second insulating layer 13b.

The connecting electrode 151 contacts the gate electrode 133 and the second electrode 143 via a hole formed by patterning the first second insulating layer 13a and the second second insulating layer 13b to partially expose the gate electrode 133 and a hole formed by patterning the second second insulating layer 13b to partially expose the second electrode 143.

In an embodiment, although not shown in FIG. 15, a connecting electrode for connecting the second electrode of the second sensing thin film transistor ST2 to the second electrode 143 of the reference capacitor $C_R$ may be further provided as shown in FIG. 14.

The third second insulating layer 13c is disposed on the connecting electrode 151. The driving voltage line PL, the data line DL, the common voltage line VCL, and the readout line RL are disposed on the third second insulating layer 13c. In an embodiment, a connecting electrode 153 for connecting the active layer 121 of the first thin film transistor T1 to the first electrode of the light-emitting device and a connecting electrode 155 for connecting the second electrode 143 of the reference capacitor $C_R$ to the sensing electrode of the sensing capacitor $C_F$ are disposed on the third second insulating layer 13c.

The connecting electrode 153 contacts the active layer 121 via a hole formed by patterning the first second insulating layer 13a, the second second insulating layer 13b, and the third second insulating layer 13c to partially expose the active layer 121. The connecting electrode 155 contacts the second electrode 143 via a hole formed by patterning the second second insulating layer 13b and the third second insulating layer 13c to partially expose the second electrode 143.

In an embodiment, although not shown in FIG. 15, referring to FIG. 14, a connecting electrode for connecting the gate electrode of the first thin film transistor T1 to the second electrode of the third thin film transistor T3 may be further provided. In an embodiment, the driving voltage line PL contacts the second electrode 125 via a hole formed by patterning the second second insulating layer 13b and the third second insulating layer 13c to partially expose the second electrode 125. The data line DL contacts the active layer 121 of the second thin film transistor T2 via a hole formed by patterning the first insulating layer 12, the first second insulating layer 13a, the second second insulating layer 13b and the third second insulating layer 13c to partially expose the active layer 121 of the second thin film transistor T2. The common voltage line VCL contacts the active layers 131 of the second sensing thin film transistor ST2 and the third sensing thin film transistor ST3 via a hole formed by patterning the first insulating layer 12, the first second insulating layer 13a, the second second insulating layer 13b and the third second insulating layer 13c to partially expose the active layers 131 of the second sensing thin film transistor ST2 and the third sensing thin film transistor ST3. The readout line RL contacts the active layer 131 of the first sensing thin film transistor ST1 via a hole formed by patterning the first insulating layer 12, the first second insulating layer 13a, the second second insulating layer 13b and the third second insulating layer 13c to partially expose the active layer 131 of the first sensing thin film transistor ST1.

The third insulating layer 14 is disposed on the driving voltage line PL, the data line DL, the common voltage line VCL and the readout line RL. In such an embodiment, the first via hole VIA1 partially exposing the connecting electrode 153 and a second via hole VIA2 partially exposing the connecting electrode 155 is defined through the third insulating layer 14.

In an embodiment, as shown in FIG. 16, a first electrode 31 of the light-emitting device contacting the connecting electrode 153 via the first via hole VIA1 and a sensing electrode 51 of the sensing capacitor $C_F$ contacting the connecting electrode 155 via the second via hole VIA2 may be disposed on the third insulating layer 14.

The pixel-defining layer 15 is disposed on the first electrode 31 of the light-emitting device EL and the sensing electrode 51 of the sensing capacitor $C_F$. In an embodiment, an opening that partially exposes the first electrode 31 of the light-emitting device EL and covers the sensing electrode 51 of the sensing capacitor $C_F$ is defined through the pixel-defining layer 15.

The intermediate layer 33 and the second electrode 35 are sequentially disposed on the first electrode 31 of the light-emitting device EL. The second electrode 35 may be patterned on the pattern area A corresponding to the sensing electrode 51 of the sensing capacitor $C_F$ to define an opening.

In an alternative embodiment, as shown in FIG. 17, the first electrode 31 of the light-emitting device EL contacting the connecting electrode 153 via the first via hole VIA1 and the connecting electrode 53 contacting the connecting electrode 155 via the second via hole VIA2 are further disposed on the third insulating layer 14.

In such an embodiment, the intermediate layer 33 and the second electrode 35 are sequentially disposed on the first electrode 31 of the light-emitting device EL. The second electrode 35 is patterned in the pattern area B corresponding to the connecting electrode 53 to define an opening.

In such an embodiment, the fifth insulating layer 18 is disposed on the second electrode 35 of the light-emitting device EL. The fifth insulating layer 18 and the pixel-defining layer 15 are patterned in an area C corresponding to the connecting electrode 53 to define an opening that partially exposes the connecting electrode 53.

In such an embodiment, the sensing electrode 55 of the sensing capacitor $C_F$ is disposed on the fifth insulating layer 18. The sensing electrode 55 of the sensing capacitor $C_F$ contacts the connecting electrode 53 in the area C. The sensing electrode 55 may have a large area overlapping with an upper portion of the second electrode 35 of the light-emitting device EL.

Figure 18:
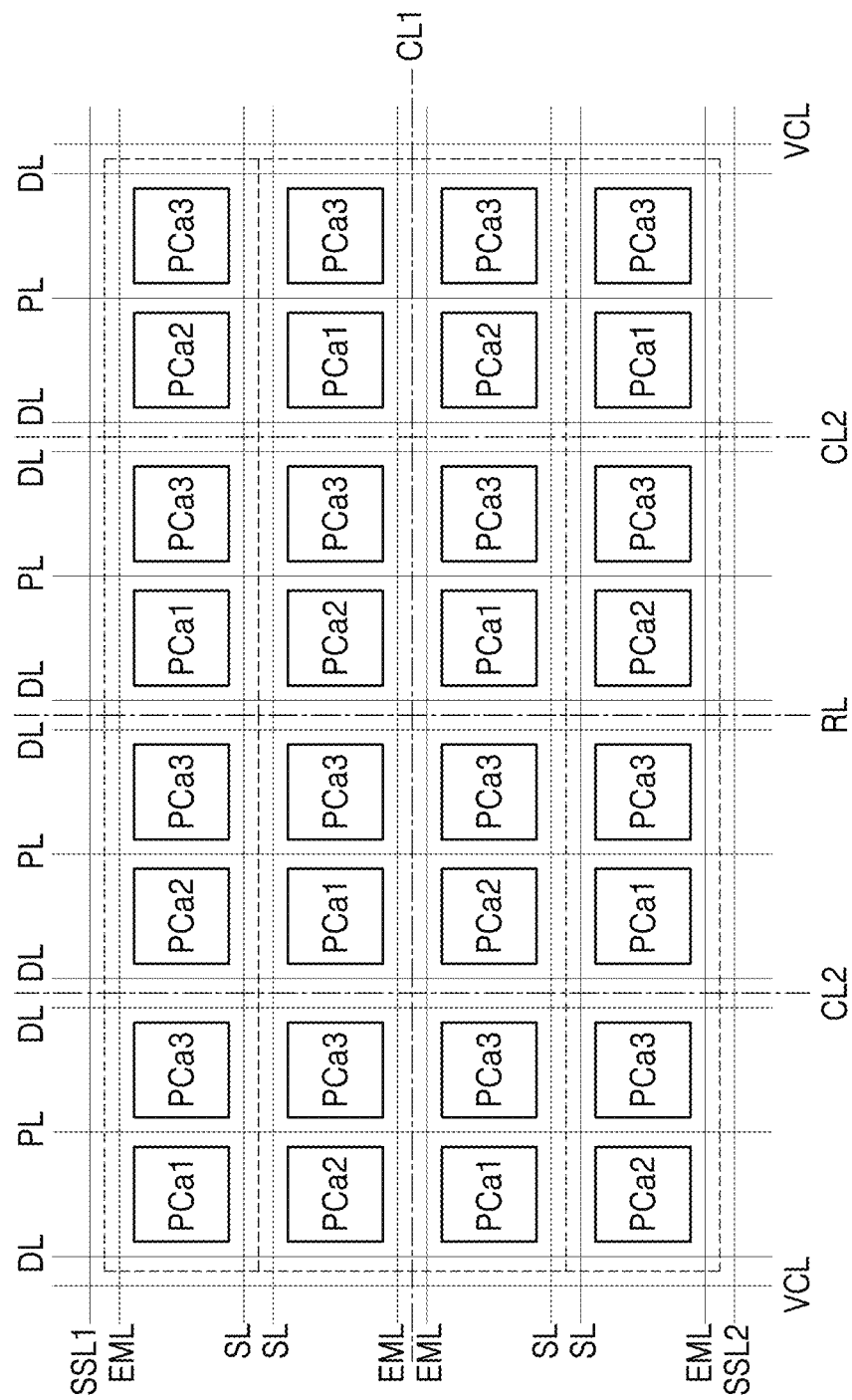
FIG. 18 is a plan view of an organic light-emitting display apparatus, showing an arrangement of the pixel circuit of FIG. 12 and the sensing circuit of FIG. 13, according to an alternative embodiment of the disclosure.

FIG. 18 is a plan view of an organic light-emitting display apparatus, showing arrangement of the pixel circuit PCa of FIG. 12 and the sensing circuit SCa of FIG. 13, according to another embodiment of the disclosure.

Referring to FIG. 18, the sensing circuit SCa is arranged to surround the pixel circuit group PCG in which the pixel circuits PCa, e.g., PCa1, PCa2 or PCa3, of 2×2 pixels are arranged symmetric with one another in longitudinal and transverse directions.

Wirings shown in FIG. 18 will now be described. The scan line SL and the emission control line EML of the pixel circuit PCa and the first sensing scan line SSL1 and the second sensing scan line SSL2 of the sensing circuit SCa extend in a row direction being spaced apart from one another. The driving voltage line PL and the data line DL of the pixel circuit PCa and the common voltage line VCL and the readout line RL of the sensing circuit SCa extend in a column direction being spaced apart from one another.

The driving voltage line PL extends to cross the center between a pair of pixel circuits PCa in the column direction.

The data lines DL of the pair of pixel circuits PCa are arranged to face each other as the driving voltage line PL is interposed therebetween.

The common voltage line VCL is arranged at a left portion of the pixel circuits PCa of 4×4 pixels in the column direction when viewed from a plan view. The common voltage line VCL is arranged on an outer portion of the data line DL when viewed from the plan view. The readout line RL is arranged in the column direction to cross centers of the pixel circuits PCa of 4×4 pixels. The readout line RL is arranged between opposite data lines DL.

The first sensing scan line SSL1 and the second sensing scan lien SSL2 are arranged on an outer portion of the emission control line EML when viewed from the plan view.

A first shield line CL1 is arranged between the first sensing scan line SSL1 and the second sensing scan line SSL2, and a second shield line CL2 is arranged between the common voltage line VCL and the readout line RL to prevent the parasitic capacitance from being generated among a plurality of pixels. The first shield line CL1 is arranged in the row direction to cross the center between the pixel circuits PCa of 4×4 pixels. The second shield line CL2 is arranged in the column direction between the data lines DL of a pair of pixels.

The first shield line CL1 may be disposed in a same layer as the scan line SL and include a same material as the scan line SL.

The second shield line CL2 may be disposed in the same layer as the data line DL and include a same material as the data line DL.

In an embodiment, the first shield line CL1 and the second shield line CL2 may be floating wirings, for example. In an alternative embodiment, the first shield line CL1 and the second shield line CL2 are electrically connected to the common voltage line VCL to receive the common voltage Vcom.

Embodiments of the invention are not limited to that shown in FIG. 18, and the number and arranging locations of the shield lines CL may be variously modified depending on the number of pixels included in the pixel circuit group, the configuration of the pixel circuit PC, and the configuration of the sensing circuit SC.

In embodiments, the transistors may be P-type thin film transistor, but embodiments are not limited thereto. Alternatively, such transistors may be an N-type thin film transistor.

According to embodiments set forth herein, the sensor may be formed simultaneously with the pixels, and thus, a display apparatus having a sensor built therein may be implemented without using an additional mask, increasing costs, and changing processes.

In such embodiments, one sensor circuit is provided in each of the plurality of pixels, and the circuits of the plurality of pixels are symmetrically arranged to reduce the variation in the parasitic capacitor among the pixels.

According to embodiments of the disclosure, the display apparatus in which pixels and the fingerprint sensors are integrally provided on the substrate a may use the entire panel as a sensor and may have a thin thickness. Lock mode may be set for each application and security in payment, sending money, etc. may be strengthened by using the fingerprint sensor.

According to embodiments of the disclosure, the display apparatus includes a fingerprint recognition sensor integrally provided therein, and thus, a mura defect caused by a variation in the parasitic capacitor among the pixels may be effectively prevented.

It should be understood that embodiments described herein should be considered in a descriptive sense only and not for purposes of limitation. Descriptions of features or aspects within each embodiment should typically be considered as available for other similar features or aspects in other embodiments.

While the present invention has been particularly shown and described with reference to exemplary embodiments thereof, it will be understood by those of ordinary skill in the art that various changes in form and details may be made therein without departing from the spirit or scope of the present invention as defined by the following claim.

What is claimed is:

1. A display apparatus including a sensor, the display apparatus comprising:
    a pixel group comprising a predetermined number of pixels, wherein each of the predetermined number of pixels includes a pixel circuit and a light-emitting device electrically connected to the pixel circuit; and
    a sensing pixel comprising a sensing circuit and a sensing electrode connected to the sensing circuit, wherein the sensing electrode forms a variable capacitor with respect to a finger,
    wherein the sensing circuit is arranged around pixel circuits of the pixel group, and the sensing electrode and an electrode of the light-emitting device are disposed in a same layer.

2. The display apparatus of claim 1, wherein the light-emitting device comprises:
    a first electrode connected to the pixel circuit;
    a second electrode opposite to the first electrode; and
    an emission layer between the first electrode and the second electrode, and
    the sensing electrode is disposed in a same layer as the first electrode of the light-emitting device.

3. The display apparatus of claim 2, wherein an opening is defined through the second electrode of the light-emitting device in a region corresponding to the sensing electrode.

4. The display apparatus of claim 2, wherein the sensing electrode extends along peripheries of first electrodes in light-emitting devices of the pixel group.

5. The display apparatus of claim 2, further comprising: an encapsulation layer on the light-emitting device.

6. The display apparatus of claim 1, further comprising: a shield line which prevents a parasitic capacitor among pixel circuits of the pixel group.

7. The display apparatus of claim 6, wherein the shield line is a floating wire.

8. The display apparatus of claim 6, wherein a predetermined voltage is applied to the shield line.

9. The display apparatus of claim 1, wherein pixel circuits in the pixel group are arranged symmetrically with one another at least in a transverse direction.

10. The display apparatus of claim 1, wherein each of the predetermined number of pixels comprises at least two sub-pixels.

11. A display apparatus including a sensor, the display apparatus comprising:
    a substrate;
    a plurality of pixel circuits on the substrate;
    a sensing circuit on the substrate and arranged to surround the plurality of pixel circuits;
    a plurality of light-emitting devices on the pixel circuits, wherein the plurality of light-emitting device includes first electrodes and second electrodes opposite to the first electrodes, and each of the first electrodes is connected to a corresponding pixel circuit from among the plurality of pixel circuits; and a sensing electrode on the sensing circuit, and electrically connected to the sensing circuit, wherein the sensing electrode forms a variable capacitor with respect to a finger, and wherein the sensing electrode and the first electrodes of the light-emitting device are disposed in a same layer.

12. The display apparatus of claim 11, wherein the sensing electrode is in a same layer as the first electrodes and extends along peripheries of the first electrodes of the plurality of light-emitting devices, and an opening is defined through each of the second electrodes in a region corresponding to the sensing electrode.

13. The display apparatus of claim 11, further comprising:

a shield line between the pixel circuits, wherein the shield line prevents a parasitic capacitor among the pixel circuits.

14. The display apparatus of claim 13, wherein the shield line is a floating wire.

15. The display apparatus of claim 13, wherein a predetermined voltage is applied to the shield line.

16. The display apparatus of claim 11, wherein the pixel circuits are arranged symmetrically with each other at least in a transverse direction.

17. The display apparatus of claim 11, further comprising:

an encapsulation layer on the plurality of light-emitting devices.

* * * * *